(12) United States Patent
Gotoh et al.

(10) Patent No.: US 7,986,258 B2
(45) Date of Patent: Jul. 26, 2011

(54) ANALOG-DIGITAL CONVERSION CELL AND ANALOG-DIGITAL CONVERTER

(75) Inventors: Kunihiko Gotoh, Kawasaki (JP); Takeshi Takayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/698,853

(22) Filed: Feb. 2, 2010

(65) Prior Publication Data

US 2010/0134337 A1 Jun. 3, 2010

Related U.S. Application Data

(63) Continuation-in-part of application No. PCT/JP2008/053430, filed on Feb. 27, 2008.

(30) Foreign Application Priority Data

Aug. 3, 2007 (JP) .................... PCT/JP2007/065240

(51) Int. Cl.
*H03M 1/12* (2006.01)
(52) U.S. Cl. ........................................ 341/155; 341/144
(58) Field of Classification Search .................. 341/155, 341/144, 161, 172
See application file for complete search history.

(56) References Cited

U.S. PATENT DOCUMENTS

| 6,784,824 | B1 * | 8/2004 | Quinn ........................... 341/172 |
| 6,803,873 | B1 | 10/2004 | Motomatsu | |
| 7,002,504 | B2 * | 2/2006 | McMahill ..................... 341/161 |
| 2005/0110670 | A1 * | 5/2005 | Cho et al. ..................... 341/158 |

FOREIGN PATENT DOCUMENTS

| JP | 2004-343292 A | 12/2004 |
| JP | 2006-74549 A | 3/2006 |

* cited by examiner

*Primary Examiner* — Peguy JeanPierre
(74) *Attorney, Agent, or Firm* — Arent Fox LLP

(57) ABSTRACT

There is provided an analog-digital conversion cell being an analog-digital conversion cell that performs an N-bit analog-digital conversion (where N is a natural number) and including: a comparison circuit (202) comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI; a first logic operation circuit (203) outputting a second digital code DB selected from Q digital codes, which is expressed by DB=DA×KA+DB0 where a constant KA is a decimal number satisfying a condition of 1<KA<2 and DB0 is a constant, based on the first digital code DA; and an analog operation circuit (201) outputting an analog output signal VO expressed by VO=A×(VI−DA×KA×(VR/A)) where A and VR are constants, based on the first digital code DA and the analog input signal VI.

18 Claims, 34 Drawing Sheets

| 1.5-b COMPARISON CIRCUIT (COMPARISON: ±KA(VR/4)) | | FIRST LOGIC OPERATION CIRCUIT | | SUB DAC (KA=5/4, A=2) | MDAC OUTPUT (KA=5/4, A=2) |
|---|---|---|---|---|---|
| DU | DL | DA | DA·KA | DB | A·DA·KA·(VR/2) | A·(VI−DA·KA·(VR/2)) |
| H | H | 1 | +5/8 | +01.01 | +(5/4)VR | 2VI−(5/4)VR |
| L | H | 0 | 0 | 00.00 | 0 | 2VI |
| L | L | −1 | −5/8 | −01.01 | −(5/4)VR | 2VI+(5/4)VR |

F I G. 17
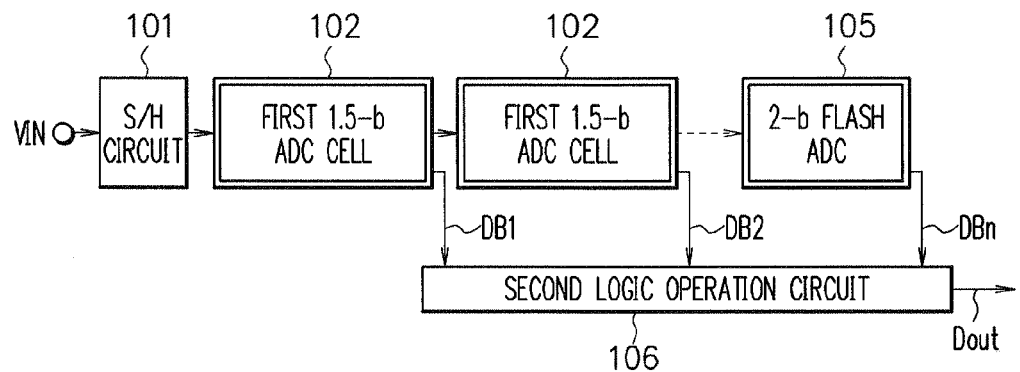
F I G. 18
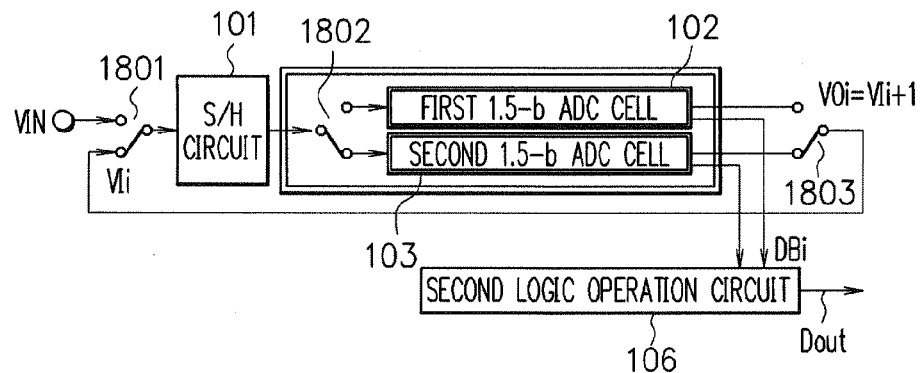
F I G. 19
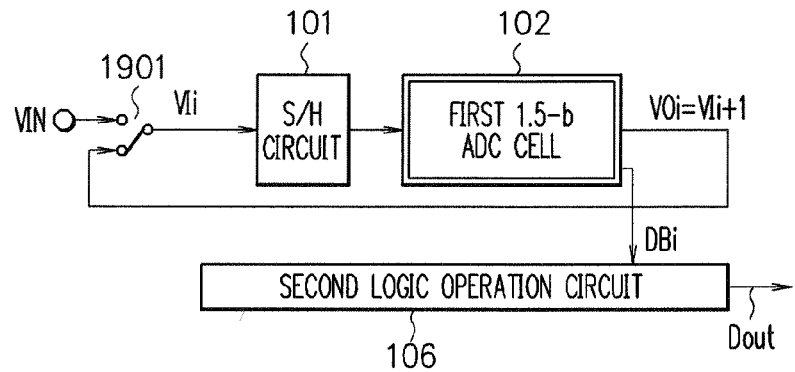

F I G. 22
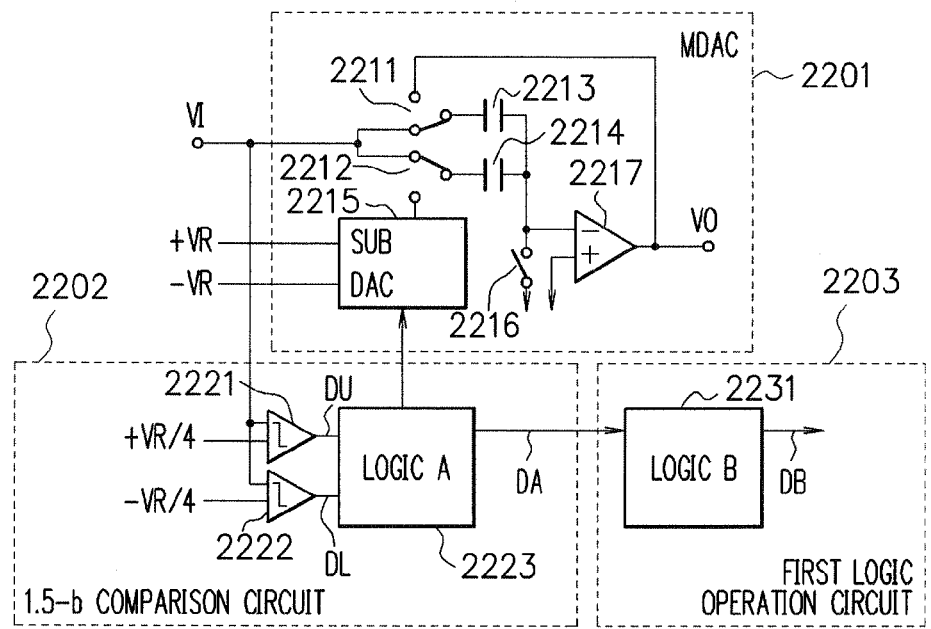
F I G. 23
| 1.5-b COMPARISON CIRCUIT (COMPARISON: ±VR/4) | | | FIRST LOGIC OPERATION CIRCUIT | | SUB DAC (A=2) | MDAC OUTPUT (A=2) |
|---|---|---|---|---|---|---|
| DU | DL | DA | DA | DB | A·DA·(VR/2) | A·(VI−DA·(VR/2)) |
| H | H | 1 | +1 | +01 | +VR | 2VI−VR |
| L | H | 0 | 0 | 00 | 0 | 2VI |
| L | L | −1 | −1 | −01 | −VR | 2VI+VR |

F I G. 27
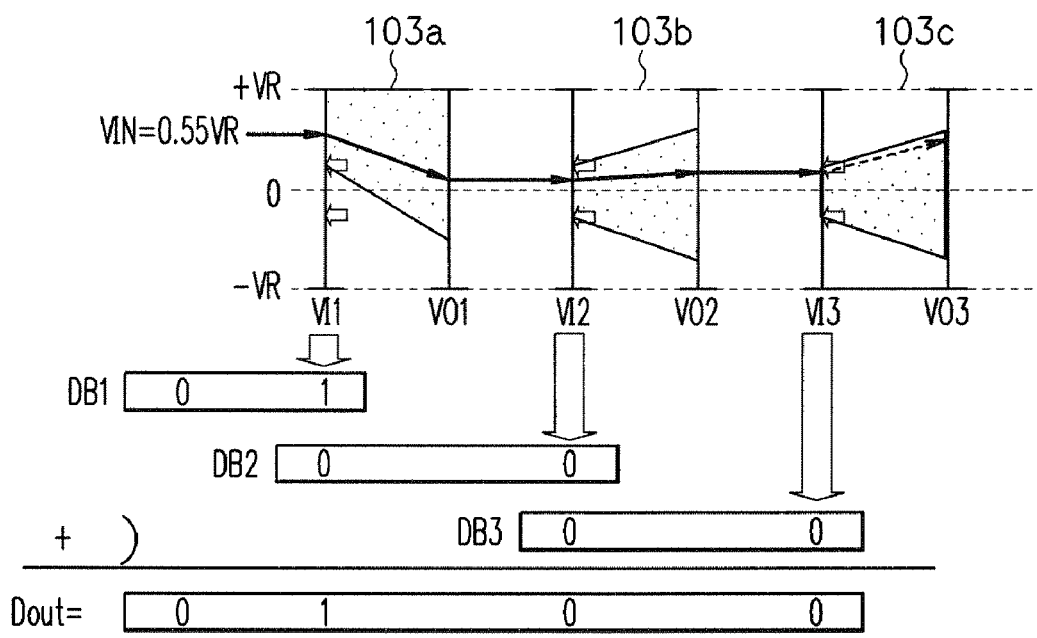

| FIRST LOGIC OPERATION CIRCUIT | | SUBDAC | |
|---|---|---|---|
| DA | DB | VD1 | VD2 |
| +3 | +011.11 | 1.25·VR | 1.25·VR |
| +2 | +010.10 | 0 | 1.25·VR |
| +1 | +001.01 | 1.25·VR | 0 |
| 0 | 000.00 | 0 | 0 |
| −1 | −001.01 | −1.25·VR | 0 |
| −2 | −010.10 | 0 | −1.25·VR |
| −3 | −011.11 | −1.25·VR | −1.25·VR |

F I G. 45
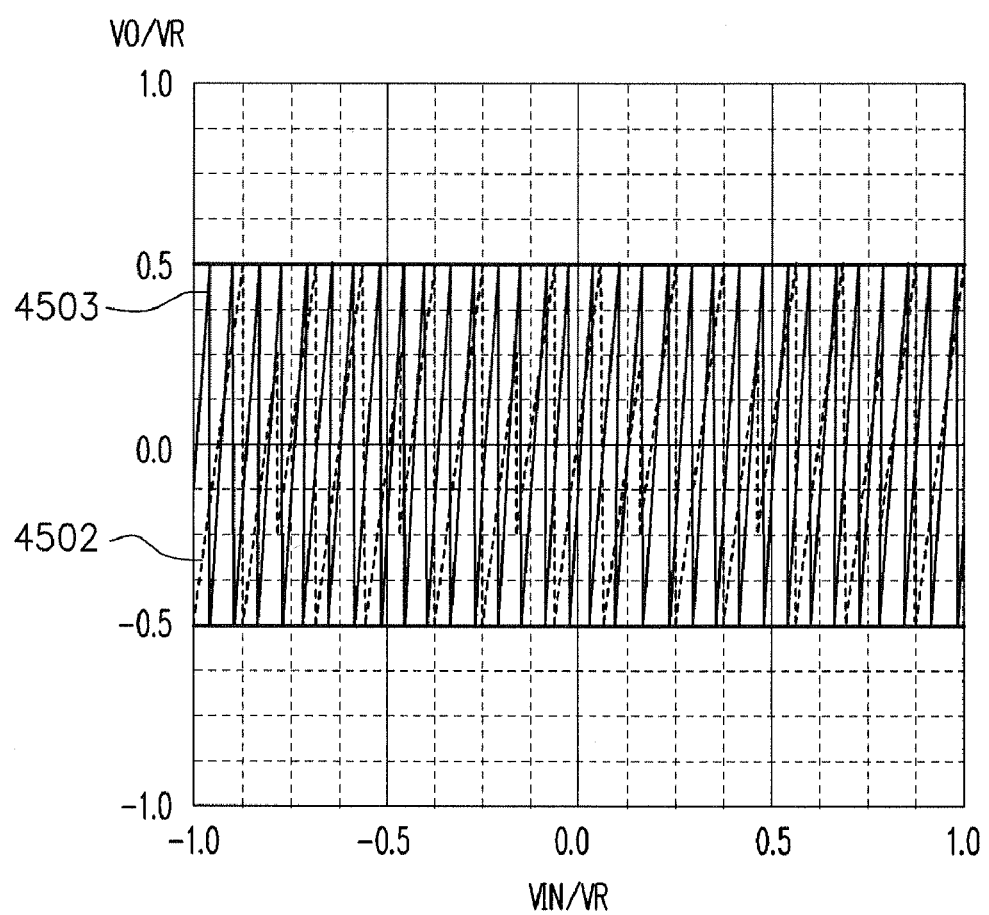

F I G. 50

| METHOD | Q (NUMBER OF AREAS) | NUMBER OF COMPARISONS | COMPARISON LEVEL | DB | VO |
|---|---|---|---|---|---|
| N-BIT REDUNDANT ADC CELL (NUMBER OF AREAS : ODD NUMBER) ($KA=1$) | $2^{N+1}-1$ | $Q-1$ | $\pm \dfrac{C}{2^{N+1}} \cdot VR$ <br> $C=(\pm 1, \pm 3, \cdots, \pm(Q-2))$ | $\left(0, \pm 1, \pm 2, \cdots, \pm \dfrac{Q-1}{2}\right)$ | $2^N\left(VIN-DA \cdot \dfrac{VR}{2^N}\right)$ |
| N-BIT REDUNDANT ADC CELL (NUMBER OF AREAS : ODD NUMBER) ($1<KA<2$) | $2^N+1$ $\sim 2^{N+1}-1$ | $Q-1$ | $KA \cdot \pm \dfrac{C}{2^{N+1}} \cdot VR$ <br> $C=(\pm 1, \pm 3, \cdots, \pm(Q-2))$ | $KA \cdot \left(0, \pm 1, \pm 2, \cdots, \pm \dfrac{Q-1}{2}\right)$ | $2^N(VIN-KA \cdot DA \cdot \dfrac{VR}{2^N})$ |
| NONREDUNDANT ADC CELL (NUMBER OF AREAS : EVEN NUMBER) ($KA=2$) | $2^N$ | $Q-1$ | $2 \cdot \pm \dfrac{C}{2^{N+1}} \cdot VR$ <br> $C=(0, \pm 2, \pm 4, \cdots, \pm(Q-2))$ | $2 \cdot \left(\pm \dfrac{1}{2}, \pm \dfrac{3}{2}, \cdots, \pm \dfrac{Q-3}{2}\right)$ | $2^N(VIN-2 \cdot DA \cdot \dfrac{VR}{2^N})$ |
| N-BIT REDUNDANT ADC CELL (NUMBER OF AREAS : EVEN NUMBER) ($KA<2$) | $2^N+2$ $\sim 2^{N+1}-2$ | $Q-1$ | $KA \cdot \pm \dfrac{C}{2^{N+1}} \cdot VR$ <br> $C=(0, \pm 2, \pm 4, \cdots, \pm(Q-2))$ | $KA \cdot \left(\pm \dfrac{1}{2}, \pm \dfrac{3}{2}, \cdots, \pm \dfrac{Q-3}{2}\right)$ | $2^N(VIN-KA \cdot DA \cdot \dfrac{VR}{2^N})$ |

F I G. 51
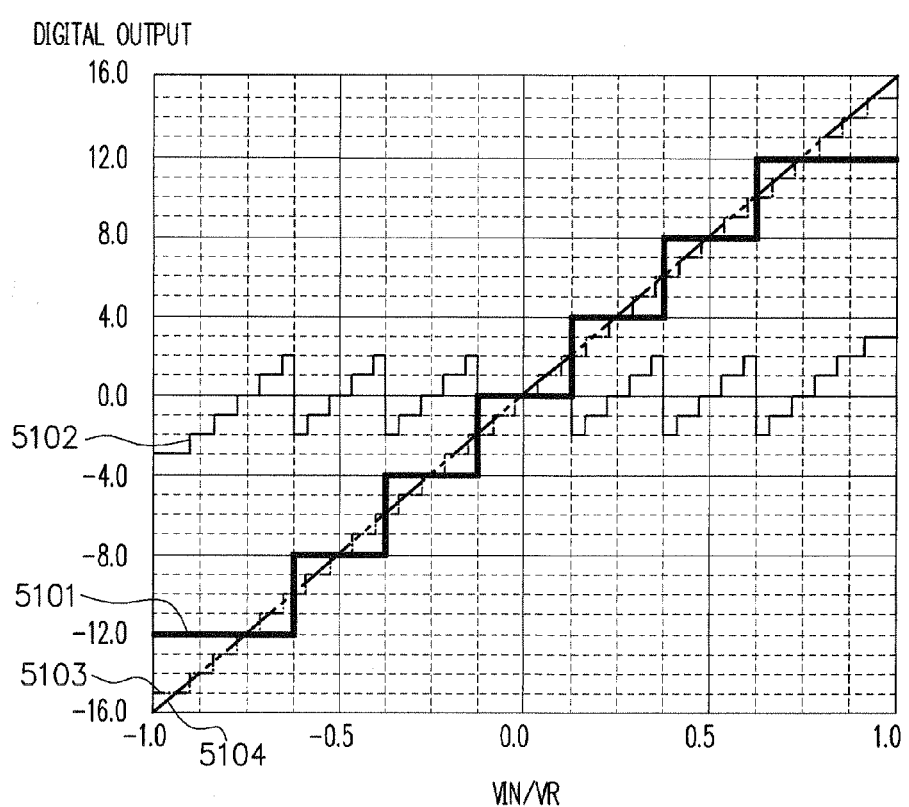

ANALOG-DIGITAL CONVERSION CELL AND ANALOG-DIGITAL CONVERTER

CROSS-REFERENCE TO RELATED APPLICATIONS

This is a continuation-in-part application of International Application No. PCT/JP2008/053430, with an international filing date of Feb. 27, 2008, which designating the United States of America.

This application is based upon and claims the benefit of priority from the prior International Application No. PCT/JP2007/065240, with an international filing date of Aug. 3, 2007, the entire contents of which are incorporated herein by reference.

FIELD

The present invention relates to an analog-digital conversion cell and an analog-digital converter.

BACKGROUND

A higher function in digital signal processing advances, and a highly accurate high speed analog-digital converter (which will be called an "ADC" hereinafter) has been required increasingly. In particular, in household use represented by digital AV and a cellular phone, reduction in price/miniaturization/reduction in power are important, and therefore an SOC (a system-on-a-chip) in which a system is integrated on one chip by a process miniaturization has been in progress aggressively. With the process miniaturization in the SOC, lowering of voltage and reduction in power are strongly required not only in a digital circuit but also in an analog circuit. The above is also applied to the ADC being an important component in the analog circuit.

FIG. 20 is a view showing a configuration example of a pipeline type analog-digital converter (which will be called a "pipeline type ADC", hereinafter). A sample and hold circuit 101 samples and holds an external analog input signal VIN to output it to a 1.5-bit analog-digital conversion cell (which will be called an "ADC cell", hereinafter) 103. The plural 1.5-bit ADC cells 103 are connected in series. The ADC cell 103 receives an analog input signal to convert the analog input signal into a digital code DB1, a digital code DB2, or the like, which is represented by three values (1.5 bits), and outputs an analog output signal being a quantization error thereof to the ADC cell 103 at a subsequent stage. A 2-bit flash (parallel type) ADC 105 converts the analog output signal of the ADC cell 103 at a final stage into a 2-bit digital code DBn. A second logic operation circuit 106 outputs a digital output signal Dout based on the digital codes DB1 to DBn. The pipeline type ADC can perform a high-speed and highly accurate analog-digital conversion, and a use range thereof has been expanding rapidly in recent years.

FIG. 21 is a view showing a configuration example of a cycle type analog-digital converter. A sample and hold circuit 101 samples and holds an analog input signal VIi to output it to a 1.5-bit ADC cell 103. Here, i represents a stage number. The ADC cell 103 similarly to the above, converts an analog input signal into a digital code DBi represented by three values (1.5 bits) and outputs an analog output signal VOi being a quantization error thereof. A switch 2101 connects an input terminal of the sample and hold circuit 101 to either a terminal of the analog output signal VOi or a terminal of an external analog input signal VIN. Firstly, the switch 2101 connects the terminal of the external analog input signal VIN and the input terminal of the sample and hold circuit 101. The ADC cell 103 receives the external analog input signal VIN as the analog input signal VIi and outputs the digital code DBi and the analog output signal VOi. Here, i is 1. Next, the switch 2101 connects the terminal of the analog output signal VOi and the input terminal of the sample and hold circuit 101. The ADC cell 103 receives the analog output signal VO1 as an analog input signal VI2 and outputs a digital code DB2 and an analog output signal VO2. By performing cycle processing thereafter, the digital codes DB1, DB2, . . . can be obtained. A second logic operation circuit 106 outputs a digital output signal Dout based on the digital codes DB1, DB2, . . . . The cycle type analog-digital converter is one type of a successive approximation type analog-digital converter, and has a characteristic such that speed is slow, but a circuit scale is small and a high resolution can be achieved easily.

With regard to a point on which receiving the analog output signal of the 1.5-bit ADC cell 103 as the analog input signal of the 1.5-bit ADC cell 103 at a subsequent stage is repeated, basic operations are the same in the both types. Here, the operation of the pipeline type analog-digital converter will be explained as an example.

FIG. 22 is a view showing a configuration example of the 1.5-bit ADC cell 103. The ADC cell 103 has an MDAC (Multiplying Digital Analog Converter) 2201, a 1.5-bit comparison circuit 2202, and a first logic operation circuit 2203. The MDAC 2201 has a first capacitance 2213, a second capacitance 2214, an operational amplifier 2217 for inputting a voltage of an interconnection point of first terminals of the first and second capacitances 2213, 2214 and outputting an analog output signal VO, a digital-analog converter (Sub DAC) 2215 outputting a first analog signal expressed by A×DA×VR/2 based on a first digital code DA, a first switch 2211 for connecting a second terminal of the first capacitance 2213 to either a terminal of an analog input signal VI or an output terminal of the operational amplifier 2217, a second switch 2212 for connecting a second terminal of the second capacitance 2214 to either the terminal of the analog input signal VI or an output terminal of the digital-analog converter 2215, and a third switch 2216 for connecting the interconnection point of the first terminals of the first and second capacitances 2213, 2214 and a reference potential. The comparison circuit 2202 has comparators 2221, 2222 and a logic circuit 2223. The first logic operation circuit 2203 has a logic circuit 2231.

FIG. 23 is a view for explaining operations of the 1.5-bit comparison circuit 2202, the first logic operation circuit 2203, and the digital-analog converter (Sub DAC) 2215.

The comparison circuit 2202 compares the analog input signal VI based on a first reference voltage (+VR/4) and a second reference voltage (−VR/4) to output the first digital code DA represented by three values in accordance with a size of the analog input signal VI. The comparator 2221 turns an output signal DU to a high level when the analog input signal VI is higher than the first reference voltage (+VR/4), and the comparator 2221 turns the output signal DU to a low level when the analog input signal VI is lower than the first reference voltage (+VR/4). The comparator 2222 turns an output signal DL to a high level when the analog input signal VI is higher than the second reference voltage (−VR/4), and the comparator 2222 turns the output signal DL to a low level when the analog input signal VI is lower than the second reference voltage (−VR/4). The logic circuit 2223 outputs "+1" as the first digital code DA when the signal DU and the signal DL are at a high level, the logic circuit 2223 outputs "0" as the first digital code DA when the signal DU is at a low level and the signal DL is at a high level, and the logic circuit 2223 outputs "−1" as the first digital code DA when the signal DU and the signal DL are at a low level. The first digital code DA is represented by the three values of +1, 0, and −1.

The first logic operation circuit 2203 has the logic circuit 2231 outputting a second digital code DB represented by three values, which is expressed by DB=DA×(01), based on the first digital code DA. When the first digital code DA is +1, 0, and −1, the second digital code DB becomes +01, 00, −01 respectively.

The digital-analog converter (Sub DAC) 2215 receives reference voltages of +VR and −VR and the first digital code DA to output the first analog signal expressed by A×DA×(VR/2). In the case of A being 2, when the first digital code DA is +1, 0, and −1, the first analog signal becomes +VR, 0, and −VR respectively. Hereinafter, explanation will be conducted in the case of A being 2.

Next, an operation of the MDAC 2201 will be explained. Firstly, the switch 2211 connects the terminal of the analog input signal VI and the second terminal of the first capacitance 2213, the switch 2212 connects the terminal of the analog input signal VI and the second terminal of the second capacitance 2214, and the switch 2216 connects the interconnection point of the first terminals of the capacitances 2213 and 2214 and the reference potential. The capacitances 2213 and 2214 are charged by the analog input signal VI. Next, the switch 2211 connects the output terminal of the operational amplifier 2217 and the second terminal of the first capacitance 2213, the switch 2212 connects the output terminal of the digital-analog converter (Sub DAC) 2215 and the second terminal of the second capacitance 2214, and the switch 2216 disconnects between the interconnection point of the first terminals of the capacitances 2213 and 2214 and the reference potential. Accordingly, the analog output signal VO of the operational amplifier 2217 is expressed by the following expression.

$$VO = 2 \times VI - DA \times VR$$

As described above, the ADC cell 103 performs an analog-digital conversion with respect to signal levels of the analog input signal VI input within a range of the reference voltages of +VR and −VR. Firstly, the analog input signal VI is divided into three areas by using the two comparators 2221 and 2222, and the first digital code by the division is set as DA=(−1, 0, 1). Here, comparison levels of the comparators 2221 and 2222 are set to be +VR/4 and −VR/4. The MDAC 2201 adds/subtracts DAi×VR to/from a result made after the analog input signal VI is doubled (=2×VI) to output an analog output signal VOi. The analog output signal VOi is expressed by the following expression. Here, represents a stage number. The first digital code DA is one of −1, 0, 1.

$$VOi = 2 \times VIi - DAi \times VR \quad (1)$$

The analog output signal VOi of each of the 1.5-bit ADC cells 103 is input as an analog input signal VIi+1 of the 1.5-bit ADC cell 103 at a subsequent stage. Accordingly, the following expressions are established.

$$VI1 = VIN \quad (2)$$

$$VIi+1 = VOi \quad (3)$$

Then, a recurrence formula of the expression of (1) is expressed as follows.

[Formula 1]

$$VOn = (2^n) \times \left( \left( VIN - \sum_{i=1}^{n} (1/2^i) \times (DAi \times VR) \right) \right) \quad (4)$$

When VOn is expressed again by (VIN/VR) in order to digitize the above formula of (4), the following formula is established.

[Formula 2]

$$(VIN/VR) = \sum_{i=1}^{n} (DAi/2^i) + (1/2^n) \times (VOn/VR) \quad (5)$$

The first term $(\Sigma(\frac{1}{2}^n) \times DAi)$ on the right side in the above formula of (5) represents the second digital code DB of the ADC cell 103. Further, the second term $((\frac{1}{2}^n)) \times (VOn/VR))$ is a quantization error. Here, if VOn is within a range of ±VR, namely is |VOn/VR|≦1, the quantization error is secured to be equal to or less than $(\frac{1}{2}^n)$. As described above, it is important that the analog output signal VO satisfies |VO/VR|≦1.

FIG. 24 is a graph showing input/output characteristics of the ADC cell 103 at an initial stage. A horizontal axis indicates an analog input signal expressed by VI/VR and a vertical axis indicates an analog output signal expressed by VO/VR. A characteristic 2401 shows a second digital code DB1, a characteristic 2402 shows an analog output signal V01, and a characteristic 2403 shows a characteristic line of VO=2×VIN. In an area 2421, the digital code DB1 becomes −01, in an area 2422, the digital code DB1 becomes 00, and in an area 2423, the digital code DB1 becomes +01. In the ADC cell 103, redundant portions 2430 exist and an allowable range of ±VR/4 exists with respect to the comparison levels ±VR/4.

FIG. 25 is a graph showing input/output characteristics of the ADC cells 103 at a second stage and thereafter. A horizontal axis indicates an analog input signal expressed by VI/VR and a vertical axis indicates an analog output signal expressed by VO/VR. A characteristic 2501 shows an analog output signal VO2 of the ADC cell 103 at the second stage, a characteristic 2502 shows an analog output signal VO3 of the ADC cell 103 at a third stage, and a characteristic 2503 shows a characteristic line of the analog input signal (VI/VR). Redundant portions 2510 exist. An output range of the operational amplifier 2217 of the ADC cell 103 at each of the stages satisfies |VO/VR|≦1 as shown in FIG. 24 and FIG. 25.

FIG. 26 is a view for explaining an operation example of the pipeline type analog-digital converter. For example, three ADC cells 103a, 103b, and 103c are connected in series. The ADC cells 103a to 103c have the same configuration as that of the ADC cell 103 in FIG. 22 respectively. In the case when VIN=0.55×VR is input, for example, a first logic operation circuit 2203 in the ADC cell 103a selects "01" from among three values as a second digital code DB1 to output it. A first logic operation circuit 2203 in the ADC cell 103b selects "00" from among three values as a second digital code DB2 to output it. A first logic operation circuit 2203 in the ADC cell 103c selects "00" from among three values as a second digital code DB3 to output it. The second logic operation circuit 106, among the digital code DB1 of "01", the digital code DB2 of "00", and the digital code DB3 of "00", bit-shifts the digital codes DB1 and DB2 and adds the digital codes DB1 to DB3 to output the digital output signal Dout of "0100".

FIG. 27 is a view for explaining another operation example of the pipeline type analog-digital converter. The case when the external analog input signal VIN is 0.55×VR will be explained as an example. The ADC cell 103a outputs the digital code DB1 of "01", the ADC cell 103b outputs the digital code DB2 of "00", and the ADC cell 103c outputs the digital code DB3 of "00". The second logic operation circuit 106 bit-shifts the digital codes DB1 to DB3 respectively and adds the digital codes DB1 to DB3 to thereby output the digital output signal Dout of "0100".

The digital codes DB of the ADC cells at the respective stages are represented by a 2-bit representation due to a ¼ unit of an input FS (=2VR). Every time the operation proceeds to one stage, a resolution is increased by one bit. That is, in the case when the digital codes DB at the respective stages are added/subtracted in the second logic operation circuit 106, the digital codes are shifted by one bit, and then the addition/subtraction of the digital codes are performed. As for the digital output signal Dout in the case of VIN=0.55×VR, "+0100" is output. Here, ± representations are adopted for a digital notation, but in the case when only the + representation is adopted, it is only necessary to add a code (1000 or 0111) being a center value in the operation of the digital codes. This addition may be performed when the digital codes DB at the respective stages are added/subtracted, but in general, the addition of "0111" is applied and "01" is added in the first logic operation circuits 2203 at the respective stages to thereby output the digital output signal Dout. The above will be explained with reference to FIG. 23. With respect to DA= (−1, 0, +1), the digital code DB is (−01, 00, +01) in the ± representations. In the + representation, (00, 01, 10) in which +01 is added to all of the codes are assigned. Accordingly, the digital output signal Dout can be obtained only by the addition of the digital codes DB at the respective stages. Hereinafter, only the ± representations are adopted in order to simplify explanation.

FIG. 28 is a graph showing the digital codes DBi at the respective stages and the digital output signal Dout with respect to the analog input signal. A horizontal axis indicates an analog input signal expressed by VI/VR and a vertical axis indicates an analog output signal expressed by VO/VR. A characteristic 2801 shows the digital code DB1, a characteristic 2802 shows the digital code DB2, a characteristic 2803 shows the digital code DB3, a characteristic 2804 shows the digital output signal Dout, and a characteristic 2805 shows the analog input signal (VI/VR). It is found that as for the respective digital codes DBi, each resolution is increased by one bit and the analog input signal (VI/VR) in the characteristic 2805 and the digital output signal Dout in the characteristic 2804 are matched well.

With a process miniaturization, how the analog-digital converter itself achieves lowering of voltage and reduction in power is a significant problem. Particularly, in a highly accurate analog-digital converter, a signal amplitude to be handled is reduced due to lowering of voltage. In order to achieve lower voltage operation while high accuracy is maintained, it is also necessary to reduce noise itself. The reason of the noise can be roughly classified into three as below.

(Problem 1) a quantization noise by a mismatch of relative accuracies of capacitance elements (Problem 2) a deterioration of a linearity of an operational amplifier and accuracy by a lack of gain (Problem 3) a transistor noise such as a thermal noise The quantization noise by a mismatch of relative accuracies of capacitance elements in (Problem 1) that is described above has been able to be corrected by a digital calibration technique in recent years.

FIG. 29 is a graph showing input/output characteristics of the operational amplifier. An area 2901 is an area where a linearity thereof is good and areas 2902 are areas where a linearity thereof is deteriorated. The deterioration of a linearity of an operational amplifier and accuracy by a lack of gain in (Problem 2) that is described above is generated in the case where as for the output, an output amplitude on a high potential side voltage VDD side or on a low potential side voltage VSS is large. As a measure for the above, as disclosed in Patent Document 1 as below, it is effective to reduce a gain of an MDAC at an initial stage and to use an analog-digital converter in an output range of an operational amplifier, where a linearity is good.

However, when a signal amplitude is made small as disclosed in Patent Document 1, there arises a necessity to also make the thermal noise in (Problem 3) that is described above small in proportion to the signal amplitude. In order to reduce the thermal noise itself, there is a necessity to square a capacitance value to be large, and power consumption in proportion to the capacitance value is also squared to be large. That is, when the signal amplitude is reduced, the capacitance value and the power consumption are squared to be large, which is a significant problem.

Here, a dynamic range is considered in order to consider the thermal noise and the signal amplitude. In the case when a gain is double, the analog output signal VO has an output range of ±2VR with respect to the input of ±VR when it is considered before addition/subtraction. This signal amplitude before addition/subtraction is defined as a dynamic range. The signal amplitude to be considered in the case when the thermal noise is considered is this dynamic range, and how the above can be made large becomes important. On the other hand, the output range of the operational amplifier is a result made after addition/subtraction are performed, and in the 1.5-bit ADC cell 103, the output range of the operational amplifier results in ±VR. An amplification factor of the signal is not changed in addition/subtraction themselves, and therefore a thermal noise level to be considered is the same as the dynamic range. That is, when a ratio of the dynamic range to (the output range of the operational amplifier) is set as R, the dynamic range is R×(the output range of the operational amplifier), and it is desirable that R is large.

However, the 1.5-bit ADC cell 103 has the following problem. That is, when the ratio R of the dynamic range defining the signal amplitude to the output range of the operational amplifier in the ADC cell 103 is considered, there is a problem that the ratio R can only be doubled in the ADC cell 103. In the analog-digital converter, the dynamic range and the output range of the operational amplifier in the ADC cell 103 at the initial stage are shown in FIG. 24, and the output range of the operational amplifier at the second stage and thereafter is shown in FIG. 25.

Here, an input signal full scale VIF is defined as (a maximum value of VI)−(a minimum value of VI). The input signal full scale VIF is VIF=2VR due to ±VR. Similarly, an operational amplifier full scale VOF is also defined as (a maximum value of VO)−(a minimum value of VO). The operational amplifier full scale VOF is, as shown in areas 2412 and 2511, VOF=2VR due to ±VR. A dynamic range full scale DRF is defined similarly. The dynamic range full scale DRF is set as 2×((a maximum value of VI)−(a minimum value of VI)) =4VR. That is, (DRF/VIF) of the output signal at the initial stage is 2 as shown in an area 2411 because the input signal is doubled. When it is considered similarly, at the second stage, doubling is performed twice, thereby making the input signal quadrupled, and (DRF/VIF) is ±4. At an Nth stage, (DRF/VIF) becomes $±2^N$. On the other hand, the output range of the operational amplifier is (VOF/VIF)=1 at all of the stages as shown in the area 2412. Thus, the ratio R of the dynamic range to the output range of the operational amplifier (=DRF/VOF) becomes double at the initial stage, it becomes quadruple at the second stage, and it becomes $2^N$ times at the Nth stage, and it is found that the initial stage is the most severe in terms of the noise.

Here, the reason why the output range of the operational amplifier is expanded is considered. At first, the expanded output range (|VO/VR|≧0.5) is found so that (VO/VR) is (−1 to −0.5) and (+0.5 to +1) and the input signal is in the vicinities of ±VR. When the input is within ±(¾)VR even at the initial stage, the output range is (−0.5≦(VO/VR)≦0.5), which is narrow. Further, a range in which the output range is expanded is found to be narrow as the operation proceeds to a subsequent stage. Thus, whether the above ratio R of the dynamic range to the output range of the operational amplifier is enabled to be large by well performing signal processing in the vicinities of ±VR is a problem.

On the other hand, an ADC cell in which the improvement is tried is disclosed in Patent Document 1 as below. FIG. 30 and FIG. 31 show an output range of an operational amplifier at each stage in an analog-digital converter in the case when the ADC cell in Patent Document 1 is used only at an initial stage.

FIG. 30 is a view showing a dynamic range and the output range of the operational amplifier in the ADC cell in Patent Document 1 at the initial stage. A horizontal axis indicates an analog input signal expressed by VI/VR and a vertical axis indicates an analog output signal expressed by VO/VR. A characteristic 3001 shows a second digital code DB1, a characteristic 3002 shows an analog output signal VO1, and a characteristic 3003 shows a characteristic line of VO=VIN. The digital code DB1 shown in the characteristic 3001 differs in areas 3021, 3022, and 3023.

FIG. 31 is a view showing the output range of the operational amplifier in the ADC cell 103 in FIG. 22 at the second stage and thereafter. A horizontal axis indicates an analog input signal expressed by VI/VR and a vertical axis indicates an analog output signal expressed by VO/VR. A characteristic 3101 shows an analog output signal VO2 in the ADC cell 103 at the second stage, a characteristic 3102 shows an analog output signal VO3 in the ADC cell 103 at a third stage, and a characteristic 3103 shows a characteristic line of the analog input signal (VI/VR).

In the ADC cell at the initial stage in FIG. 30, when it is set in a manner that an amplification factor is 1 time, comparison levels are ±VR/2, and DA×VR is added/subtracted, as shown in an area 3012, (|VO/VR|≧0.5) is achieved. Accordingly, the output range of the ADC cell 103 used at the second stage and thereafter in FIG. 31 also becomes (|VO/VR|≧0.5) as shown in an area 3111, and therefore the output range can be reduced to half as compared to those in FIG. 24 and FIG. 25. However, with respect to an MDAC at the initial stage, when the dynamic range is considered in terms of the noise, as shown in an area 3011, (DRF/VIF) is equal to 1 because a gain is made 1 time. Even when the output range of the operational amplifier (VOF/VIF) is reduced to 0.5, the ratio R is (DRF/VOF) =2, which is the same as those in FIG. 22 to FIG. 25 and is not improved. That is, it is found that the above analog-digital converter is effective for (Problem 2) that is described above, but is not effective for the expansion of R in the ADC cell at the initial stage, which is the most important in (Problem 3) that is described above.

Patent Document 1: Japanese Laid-open Patent Application No. 2004-343292

SUMMARY

According to one aspect of the present invention, there is provided an analog-digital conversion cell being an analog-digital conversion cell that performs an N-bit analog-digital conversion (where N is a natural number) and including: a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI; a first logic operation circuit outputting a second digital code DB selected from Q digital codes, which is expressed by DB=DA×KA+DB0 where a constant KA is a decimal number satisfying a condition of 1<KA<2 and DB0 is a constant, based on the first digital code DA; and an analog operation circuit outputting an analog output signal VO expressed by VO=A×(VI−DA×KA×(VR/A)) where A and VR are constants, based on the first digital code DA and the analog input signal VI.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 17 is a view showing a configuration example of a pipeline type analog-digital converter according to another embodiment of the present invention;

FIG. 18 is a view showing a configuration example of a cycle type analog-digital converter according to another embodiment of the present invention;

FIG. 19 is a view showing a configuration example of a cycle type analog-digital converter according to another embodiment of the present invention;

FIG. 22 is a view showing a configuration example of a conventional 1.5-bit ADC cell;

FIG. 23 is a view for explaining operations of a 1.5-bit comparison circuit, a first logic operation circuit, and a digital-analog converter (Sub DAC) that are conventional;

FIG. 27 is a view for explaining another operation example of the conventional pipeline type analog-digital converter;

FIG. 45 is a view showing input/output characteristics of the ADC cells at a second stage and a third stage in a pipeline type analog-digital converter in which the 2-bit ADC cell (the number of areas is 7, KA=1.25) in FIG. 43 is used at an initial stage and the 1.5-bit ADC cells (the number of areas is 3, KA=1) are used at the second stage and thereafter;

FIG. 50 is a view showing a constitution and a characteristic of the N-bit ADC cell; and FIG. 51 is a graph showing digital codes at an initial stage and a second stage with respect to an analog input signal, and an AD conversion result at the second stage.

DESCRIPTION OF EMBODIMENTS

Figure 1:
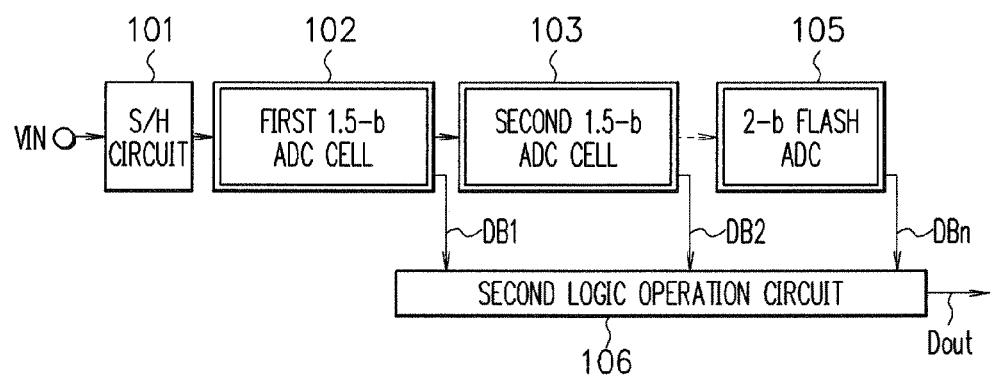
FIG. 1 is a view showing a configuration example of a pipeline type analog-digital converter according to an embodiment of the present invention.

FIG. 1 is a view showing a configuration example of a pipeline type analog-digital converter according to an embodiment of the present invention. The analog-digital converter analog-digital converts an external analog input signal VI to output a digital output signal Dout. A sample and hold circuit 101 samples and holds an external analog input signal (a voltage) VIN to output it to a 1.5-bit ADC cell 102. The first 1.5-bit ADC cell 102 at an initial stage, a plurality of second 1.5-bit ADC cells 103 and a 2-bit flash (parallel type) ADC 105 at a final stage are connected in series. The first ADC cell 102 receives an analog input signal to convert the analog input signal into a digital code DB1 represented by three values (1.5 bits), and outputs an analog output signal being a quantization error thereof to the ADC cell 103 at a subsequent stage. Details thereof will be explained later. The second ADC cell 103 receives the analog output signal output from the ADC cell 102 at the preceding stage or the ADC cell 103 at the preceding stage as an analog input signal and converts the analog input signal into a digital code DB2 represented by three values (1.5 bits), or the like to output an analog output signal being a quantization error thereof to the ADC cell 103 at a subsequent stage or the flash ADC 105. The ADC cell 103 is the same as that in the above-described explanation in FIG.

Figure 24:
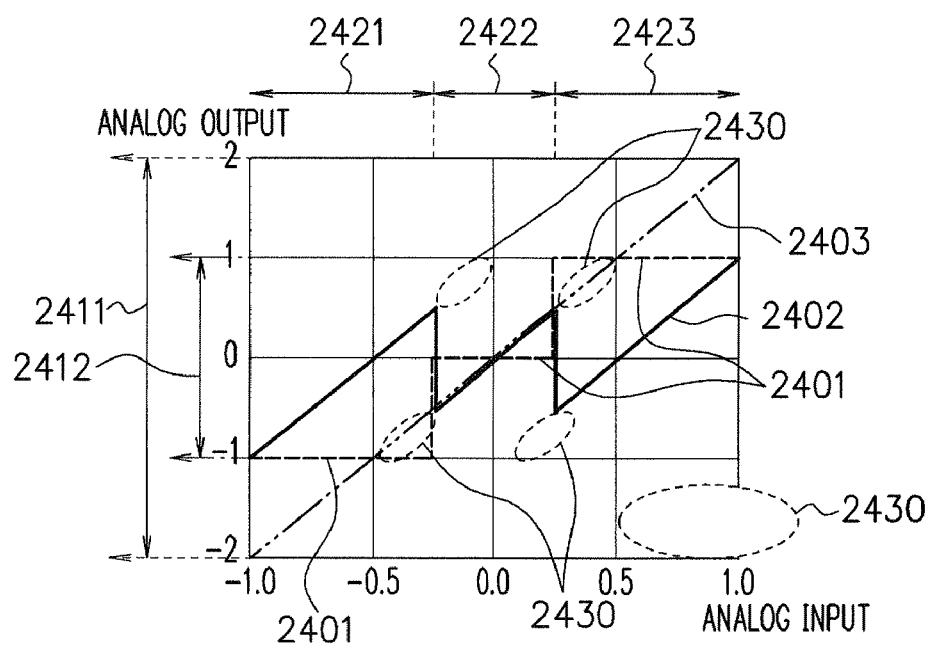
FIG. 24 is a graph showing input/output characteristics of the conventional 1.5-bit ADC cell at an initial stage.

22 to FIG. 24. The 2-bit flash ADC 105 converts the analog output signal of the ADC cell 103 at the preceding stage into a 2-bit digital code DBn. A second logic operation circuit 106 outputs the digital output signal Dout based on the digital codes DB1 to DBn. The pipeline type analog-digital converter can perform a high-speed and highly accurate analog-digital conversion. Note that the embodiment of the present invention is not limited to the above-described configuration, and the 2-bit flash ADC 105 may be set as a 3-bit or more flash ADC.

Figure 2:
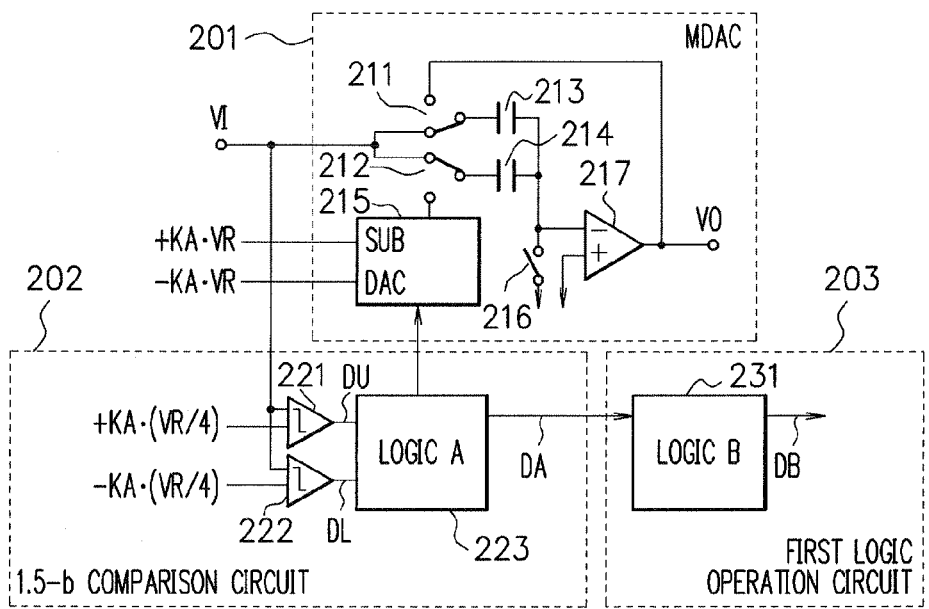
FIG. 2 is a view showing a configuration example of a first 1.5-bit ADC cell.

FIG. 2 is a view showing a configuration example of the first 1.5-bit ADC cell 102. The ADC cell 102 has an MDAC 201, a 1.5-bit comparison circuit 202, and a first logic operation circuit 203. The MDAC 201 has a first capacitance 213, a second capacitance 214, an operational amplifier 217 for inputting a voltage of an interconnection point of first terminals of the first and second capacitances 213, 214 and outputting an analog output signal (voltage) VO, a digital-analog converter (Sub DAC) 215 outputting a first analog signal expressed by $A \times DA \times KA \times VR/2$ based on a first digital code DA, a first switch 211 for connecting a second terminal of the first capacitance 213 to either a terminal of the analog input signal (voltage) VI or an output terminal of the operational amplifier 217, a second switch 212 for connecting a second terminal of the second capacitance 214 to either the terminal of the analog input signal VI or an output terminal of the digital-analog converter 215, and a third switch 216 for connecting the interconnection point of the first terminals of the first and second capacitances 213, 214 and a reference potential. The operational amplifier 217 has a − input terminal thereof connected to the interconnection point of the first terminals of the capacitances 213 and 214, and has a + input terminal thereof connected to the reference potential. The comparison circuit 202 has comparators 221 and 222 and a logic circuit 223. The first logic operation circuit 203 has a logic circuit 231.

Figures 3, 4:
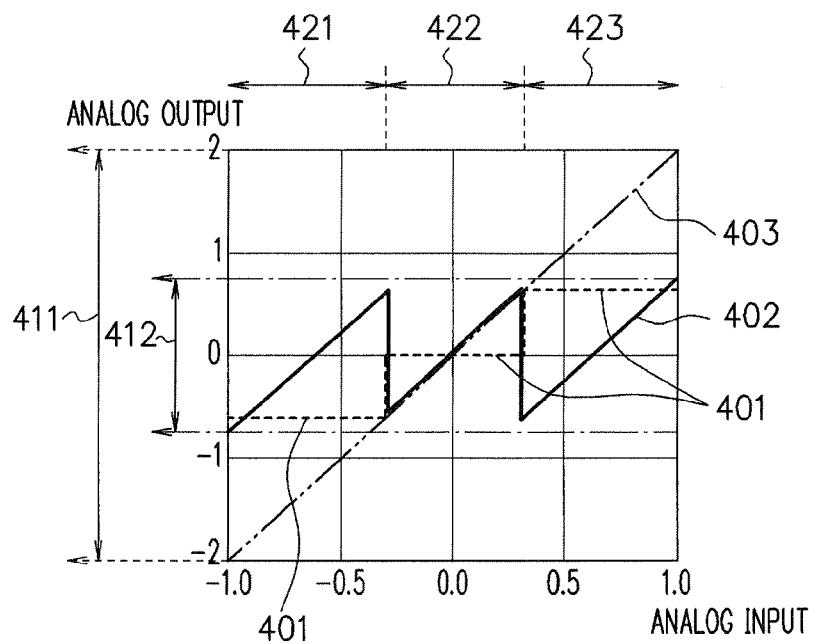
FIG. 3 is a view for explaining operations of a 1.5-bit comparison circuit, a first logic operation circuit, and a digital-analog converter (Sub DAC)
FIG. 4 is a graph showing input/output characteristics of the first ADC cell at an initial stage.

FIG. 3 is a view for explaining operations of the 1.5-bit comparison circuit 202, the first logic operation circuit 203 and the digital-analog converter (Sub DAC) 215.

The comparison circuit 202 compares the analog input signal VI based on a first reference voltage $(+KA \times VR/4)$ and a second reference voltage $(-KA \times VR/4)$, and outputs the first digital code DA represented by three values in accordance with a size of the analog input signal VI. A constant KA is 1 in a second ADC cell 103 in FIG. 22, but a constant KA in the first ADC cell 102 is, for example, 5/4. In the above case, the first reference voltage is $+KA \times VR/4=+(5/16) \times VR$, and the second reference voltage is $-KA \times VR/4=-(5/16) \times VR$. The comparator 221 turns an output signal DU to a high level when the analog input signal VI is higher than the first reference voltage $(+KA \times VR/4)$, and the comparator 221 turns the output signal DU to a low level when the analog input signal VI is lower than the first reference voltage $(+KA \times VR/4)$. The comparator 222 turns an output signal DL to a high level when the analog input signal VI is higher than the second reference voltage $(-KA \times VR/4)$, and the comparator 222 turns the output signal DL to a low level when the analog input signal VI is lower than the second reference voltage $(-KA \times VR/4)$. The logic circuit 223 outputs "+1" as the first digital code DA when the signal DU and the signal DL are at a high level, the logic circuit 223 outputs "0" as the first digital code DA when the signal DU is at a low level and the signal DL is at a high level, and the logic circuit 223 outputs "−1" as the first digital code DA when the signal DU and the signal DL are at a low level. The first digital code DA is represented by the three values of +1, 0, and −1.

The first logic operation circuit 203 has the logic circuit 231 outputting a second digital code DB represented by three values, which is expressed by $DB=DA \times KA=DA \times (01.01)$, based on the first digital code DA. The constant KA is, for example, 5/4 (which is "01.01" in a binary number). When the first digital code DA is "+1", "0", and "−1", the second digital code DB becomes "+01.01", "00.00", "−01.01" respectively.

The digital-analog converter (Sub DAC) 215 receives reference voltages of $+KA \times VR$ and $-KA \times VR$ and the first digital code DA to output the first analog signal expressed by $A \times DA \times KA \times (VR/2)$. In the case of A being 2 and KA being 5/4, when the first digital code DA is "+1", "0", and "−1", the first analog signal becomes "$+(5/4) \times VR$", "0", and "$-(5/4) \times VR$" respectively.

Next, an operation of the MDAC 201 will be explained. Firstly, the switch 211 connects the terminal of the analog input signal VI and the second terminal of the first capacitance 213, the switch 212 connects the terminal of the analog input signal VI and the second terminal of the second capacitance 214, and the switch 216 connects the interconnection point of the first terminals of the capacitances 213 and 214 and the reference potential. The capacitances 213 and 214 are charged by the analog input signal VI. Next, the switch 211 connects the output terminal of the operational amplifier 217 and the second terminal of the first capacitance 213, the switch 212 connects the output terminal of the digital-analog converter (Sub DAC) 215 and the second terminal of the second capacitance 214, and the switch 216 disconnects between the interconnection point of the first terminals of the capacitances 213 and 214 and the reference potential. Accordingly, the analog output signal VO of the operational amplifier 217 is expressed by the following expression.

$$VO=A \times (VI-DA \times KA \times (VR/2))$$

Here, a constant A is 2 and the constant KA is 5/4, and therefore the following expression is established.

$$VO=2 \times VI-DA \times (5/4) \times VR$$

Here, the constant A is not limited to 2. In the above case, the MDAC (an analog operation circuit) 201 has the two or more capacitances 213, 214, and the like for sampling the analog input signal VI and the single operational amplifier 217, and when the MDAC 201 outputs the analog output signal VO, at least the one or more capacitances out of the above-described capacitances 213, 214, and the like is/are connected to the output of the operational amplifier 217, and the other capacitance/capacitances is/are connected to a voltage in accordance with the first digital code DA.

FIG. 4 is a graph showing input/output characteristics of the first ADC cell 102 at the initial stage. A horizontal axis indicates an analog input signal expressed by VI/VR and a vertical axis indicates an analog output signal expressed by VO/VR. A characteristic 401 shows a second digital code DB1, a characteristic 402 shows an analog output signal VO1, and a characteristic 403 shows a characteristic line of $VO=2 \times VIN$. In an area 421, the digital code DB1 becomes "−01.01", in an area 422, the digital code DB1 becomes "00.00", and in an area 423, the digital code DB1 becomes "+01.01".

An output range of the operational amplifier 217 in the ADC cell 102 satisfies $|VO/VR| \leq 3/4$ as shown in an area 412. Here, an input signal full scale VIF is $VIF=2VR$ due to $\pm VR$. Further, a dynamic range full scale DRF becomes $2 \times ((\text{a maximum value of VI})-(\text{a minimum value of VI}))=4VR$. Further, an operational amplifier full scale VOF is (a maximum value of VO)−(a minimum value of VO)=$2 \times (3/4) \times VR$. It is found that a dynamic range is (DRF/VIF)=2 as shown in an area 411, but, as shown in the area 412, the output range of the operational amplifier 217 is (VOF/VIF)=¾, which is narrow.

Figure 5:
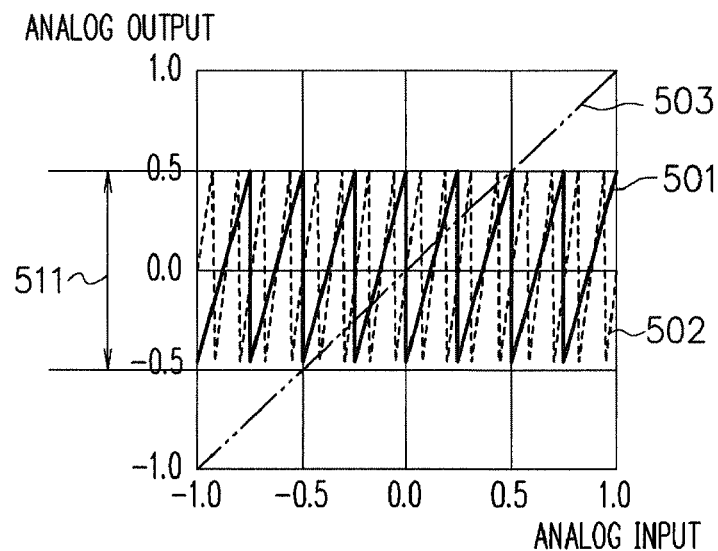
FIG. 5 is a graph showing input/output characteristics of a second ADC cell at a second stage and thereafter.

FIG. 5 is a graph showing input/output characteristics of an operational amplifier 217 in the second ADC cell 103 at the second stage and thereafter. A horizontal axis indicates an analog input signal expressed by VI/VR and a vertical axis indicates an analog output signal expressed by VO/VR. A characteristic 501 shows an analog output signal VO2 of the ADC cell 103 at the second stage, a characteristic 502 shows an analog output signal VO3 of the ADC cell 103 at a third stage, and a characteristic 503 shows the characteristic line of the analog input signal (VI/VR). An output range of the operational amplifier 217 in the ADC cell 103 at the second stage and thereafter satisfies |VO/VR|≦0.5 as shown in an area 511.

Figure 6:
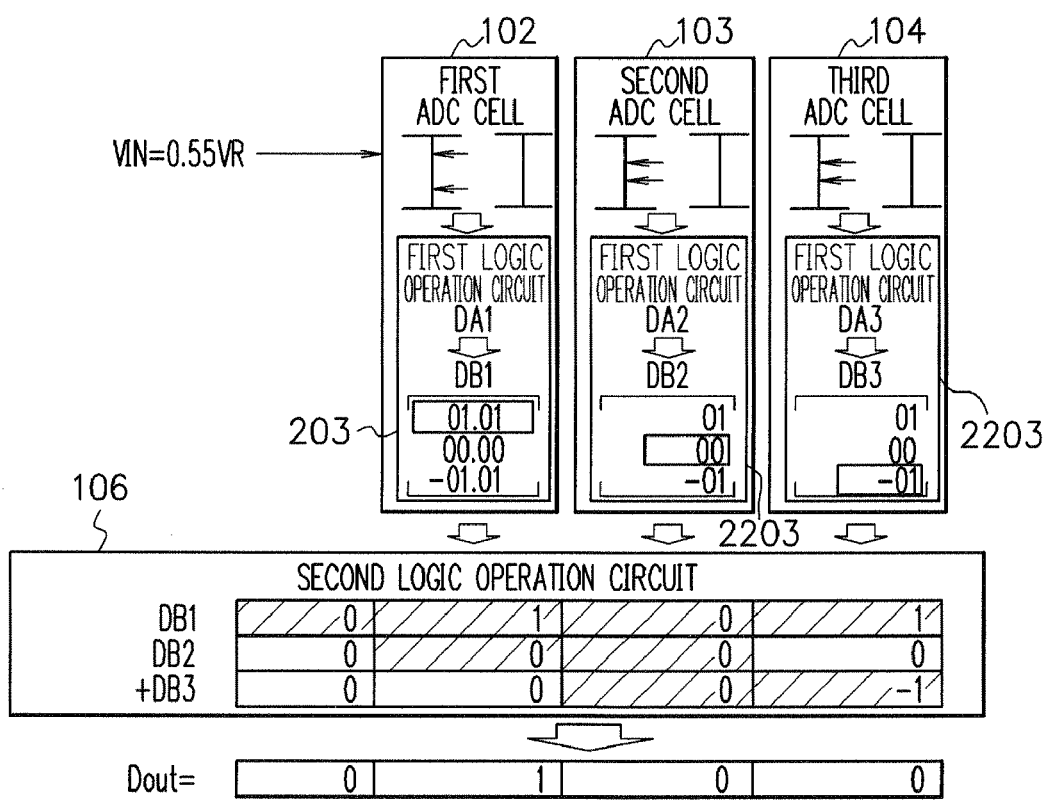
FIG. 6 is a view for explaining an operation example of the pipeline type analog-digital converter in FIG. 1.

FIG. 6 is a view for explaining an operation example of the pipeline type analog-digital converter in FIG. 1. For example the three ADC cells 102, 103, and 104 are connected in series. The first ADC cell 102 has the configuration in FIG. 2 (KA=⅝), and the second ADC cell 103 and the third ADC cell 104 have a configuration in FIG. 22 (KA=1). In the case when VIN=0.55×VR is input, for example, the first logic operation circuit 203 in the first ADC cell 102 selects "+01.01" from among the three values as the second digital code DB1 to output it. A first logic operation circuit 2203 in the second ADC cell 103 selects "00" from among three values as the second digital code DB2 to output it. A first logic operation circuit 2203 in the third ADC cell 104 selects "−01" from among three values as a second digital code DB3 to output it. The second logic operation circuit 106 bit-shifts the digital code DB2 among the digital code DB1 of "+01.01", the digital code DB2 of "00", and the digital code DB3 of "−01" and adds the digital code DB1 to the digital code DB3 to output the digital output signal Dout of "0100".

Figure 7:
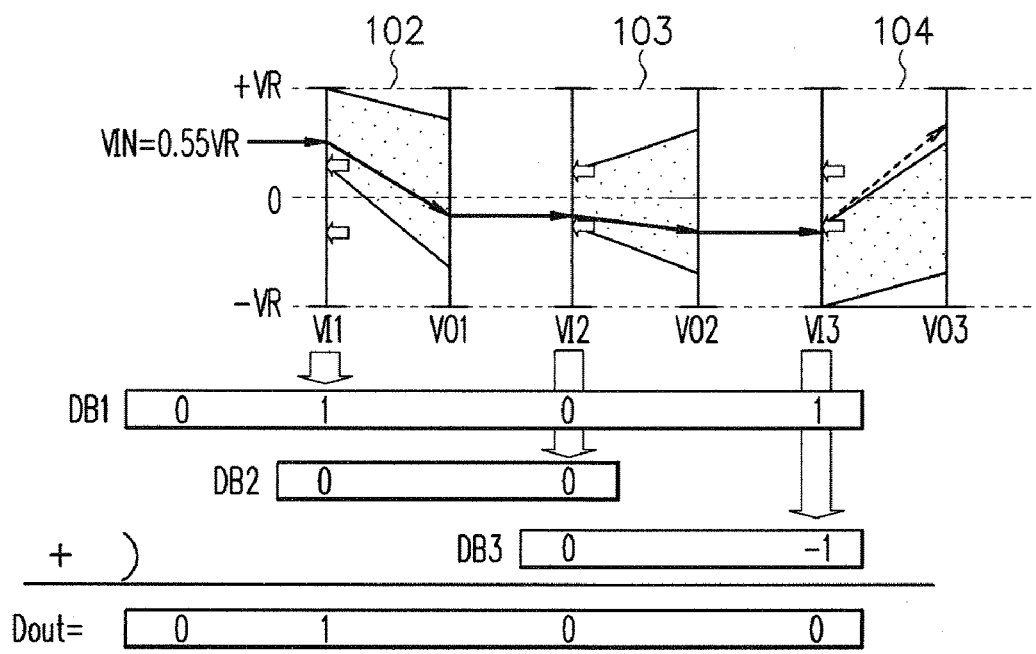
FIG. 7 is a view for explaining another operation example of the pipeline type analog-digital converter.

FIG. 7 is a view for explaining another operation example of the pipeline type analog-digital converter. The case when the external analog input signal VIN is 0.55×VR will be explained as an example. The ADC cell 102 outputs the digital code DB1 of "+01.01", the ADC cell 103 outputs the digital code DB2 of "00", and the ADC cell 104 outputs the digital code DB3 of "−1". The second logic operation circuit 106 bit-shifts the digital code DB2 among the digital codes DB1 to DB3 and adds the digital code DB1 to the digital code DB3 to output the digital output signal Dout of "0100".

In the analog-digital converter, every time the operation proceeds to one stage, a resolution is increased by one bit. That is, in the case when the digital codes DB at the respective stages are added/subtracted in the second logic operation circuit 106, one bit is shifted and the addition/subtraction are performed. In the case of VIN=0.55×VR, "+0100" is output as the digital output signal Dout. Here, a digital notation adopts ± representations, but in the case when only the + representation is adopted, it is only necessary to add a digital code DB0 (1000 or 0111) being a center value in the operation of the digital codes. The digital code DB0 is a constant. This addition may be performed when the addition/subtraction of the digital codes DB at the respective stages are performed, but in general, the addition of "0111" is applied and "01" is added in the first logic operation circuits 203 at the respective stages, and thereby the digital output signal Dout can be output.

Figure 8:
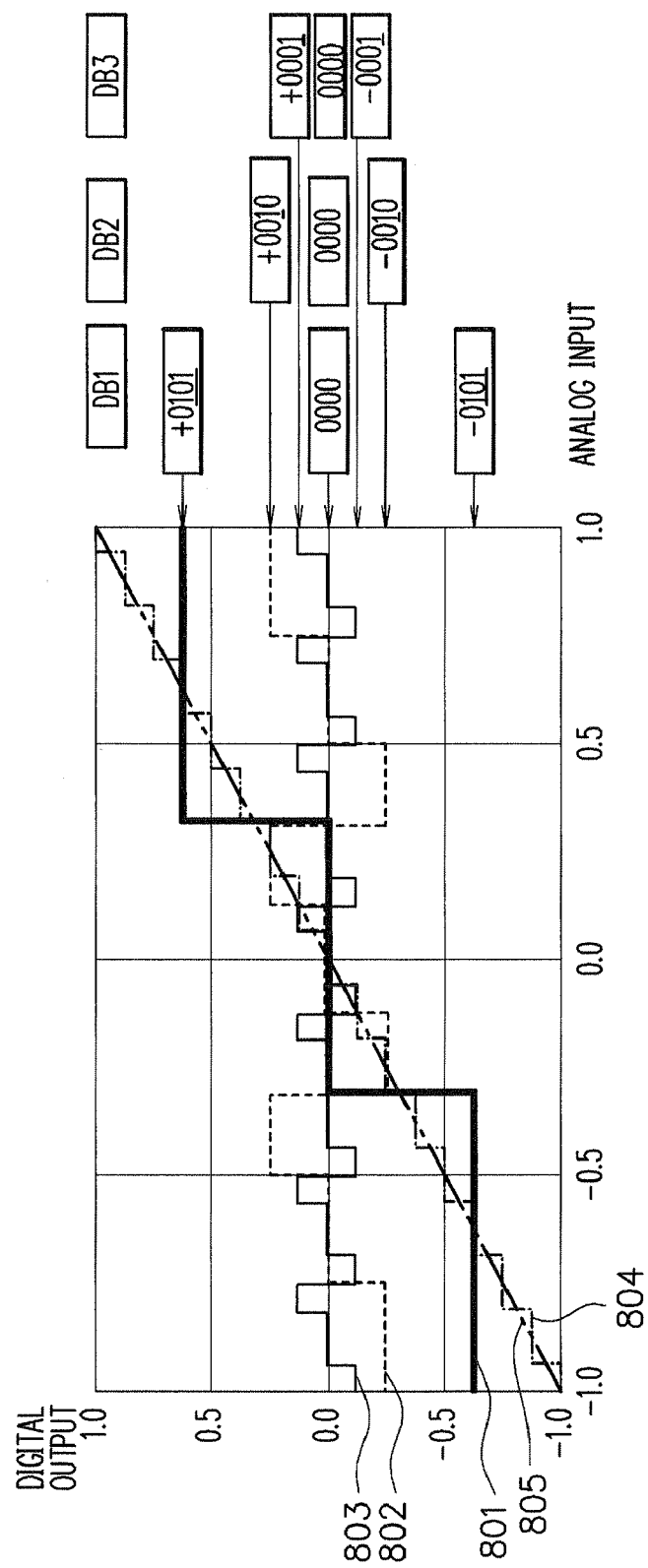
FIG. 8 is a graph showing digital codes at respective stages and a digital output signal with respect to an analog input signal.

FIG. 8 is a graph showing digital codes DBi at the respective stages and the digital output signal Dout with respect to the analog input signal. A horizontal axis indicates an analog input signal expressed by VI/VR and a vertical axis indicates an analog output signal expressed by VO/VR. A characteristic 801 shows the digital code DB1, a characteristic 802 shows the digital code DB2, a characteristic 803 shows the digital code DB3, a characteristic 804 shows the digital output signal Dout, and a characteristic 805 shows the analog input signal (VI/VR). It is found that as for the respective digital codes DBi, a resolution is increased by one bit and the analog input signal (VI/VR) in the characteristic 805 and the digital output signal Dout in the characteristic 804 are matched well.

Figure 25:
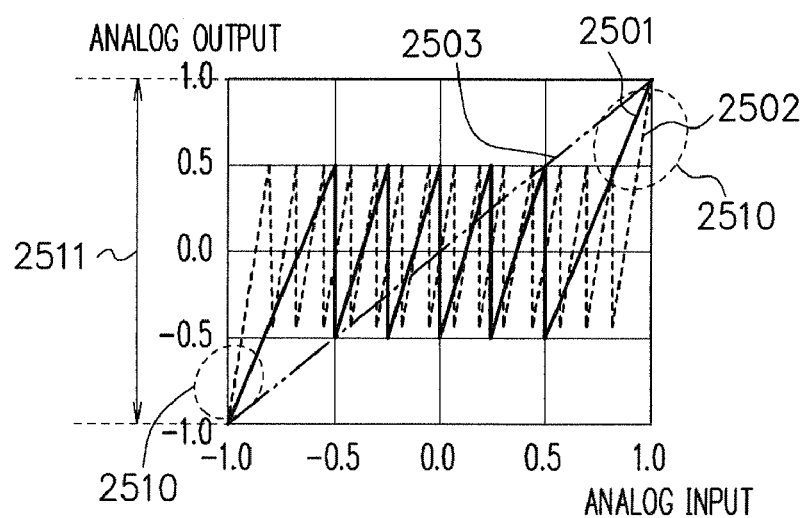
FIG. 25 is a graph showing input/output characteristics of the conventional 1.5-bit ADC cell at a second stage and thereafter.
Figure 26:
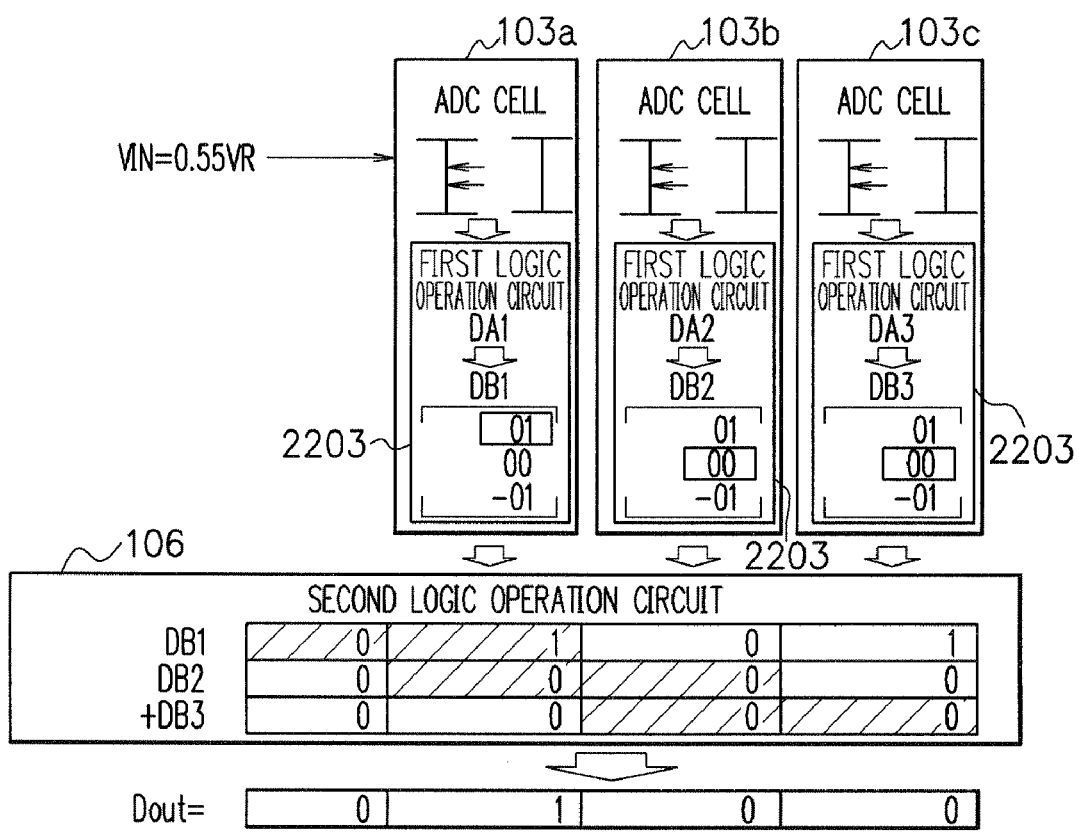
FIG. 26 is a view for explaining an operation example of the conventional pipeline type analog-digital converter.
Figure 28:
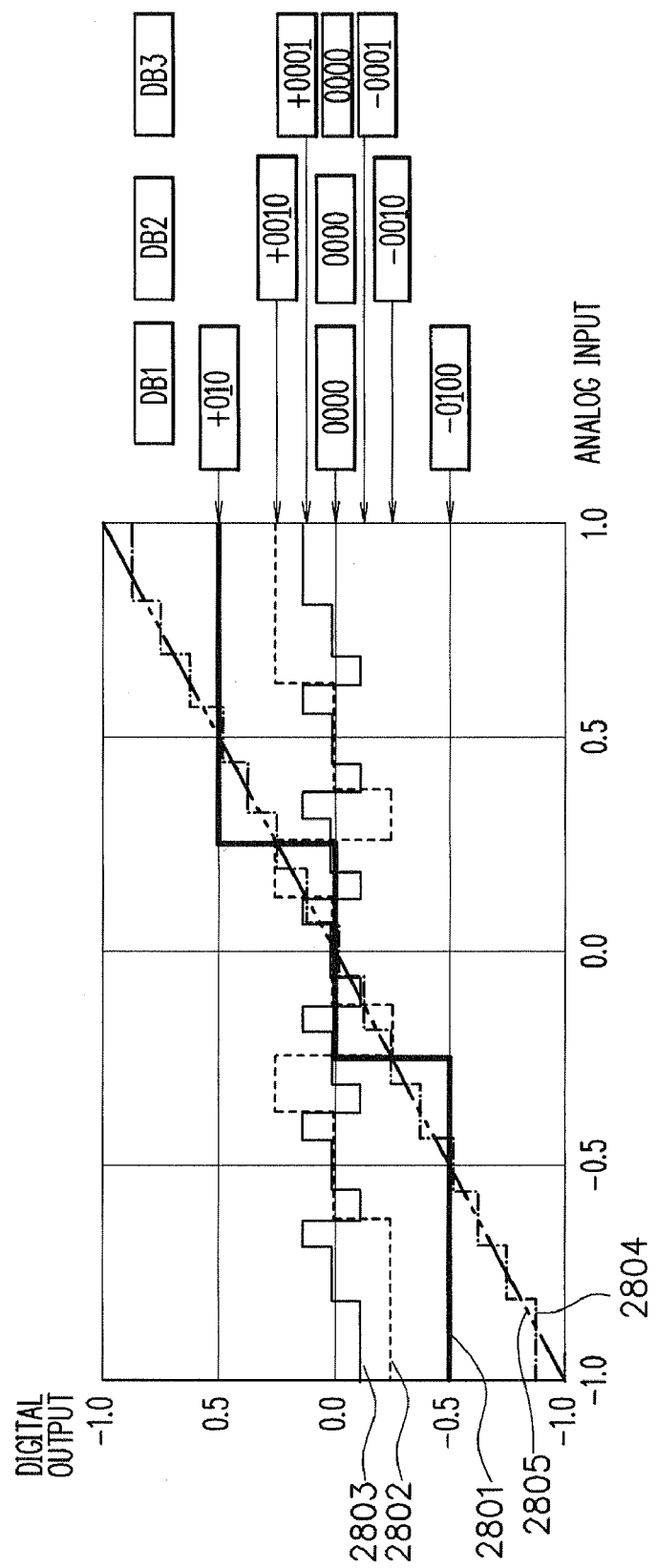
FIG. 28 is a graph showing digital codes at respective stages and a digital output signal with respect to an analog input signal in the conventional 1.5-bit ADC cell.
Figure 29:
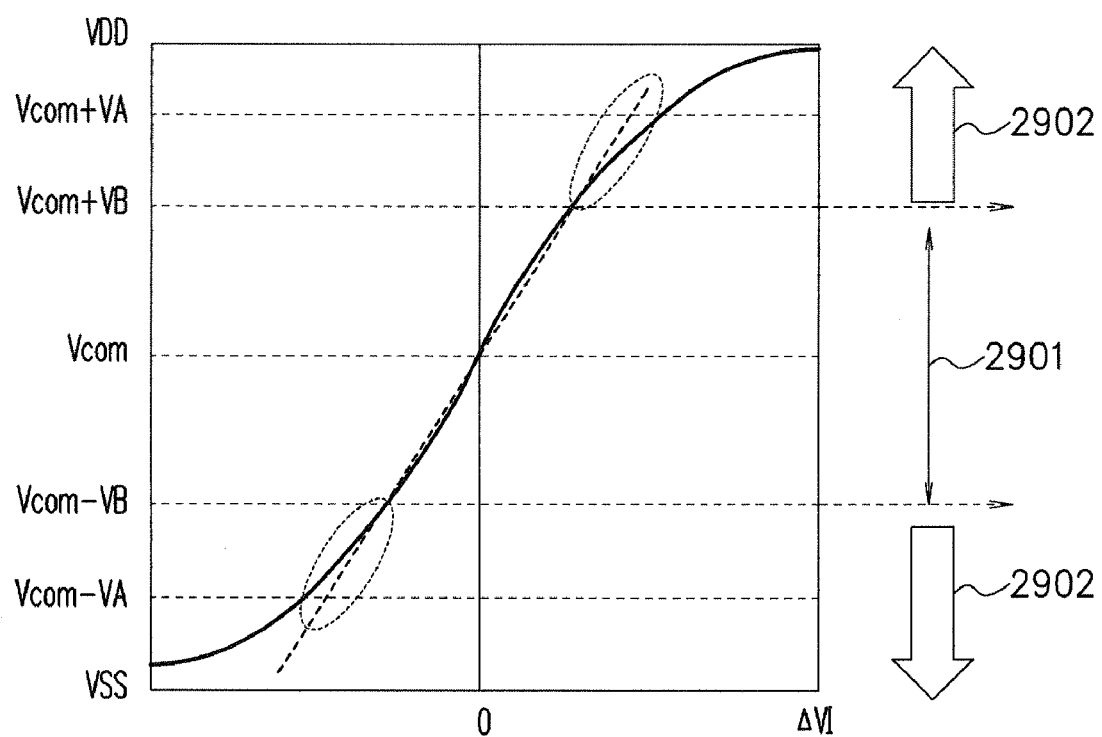
FIG. 29 is a graph showing input/output characteristics of an operational amplifier.

It is found that the range of the analog output signal VO of the operational amplifier in the ADC cell at the second stage and thereafter is |VO/VR|≦0.5 as shown in the area 511 in FIG. 5 and is reduced to half compared with |VO/VR|≦1 shown in an area 2511 in an analog-digital converter in FIG. 25. In order to make an analog output range of the operational amplifier in the ADC cell at the second stage and thereafter |VO/VR|≦0.5 as described above, the output range of the operational amplifier in the ADC cell 102 at the initial stage has to be |VO/VR|≦0.75VR. A setting range of KA for the above is ⅝≦KA≦¾. The constant KA is preferable to be a decimal number that is equal to or more than ⅝ and equal to or less than ¾.

This setting range of KA is established by changing a reference voltage of the ADC cell 103 at the second stage even in the case when an amplification factor of the ADC cell 102 at the initial stage is changed. When in the ADC cell 102 at the initial stage, the amplification factor is set as A, a reference voltage VR is set as VR1, and in the ADC cell at the second stage, the reference voltage VR is set as VR2, and if the reference voltage of the ADC cell at the second stage is set to satisfy VR2=VR1×(A/2), it is possible to make the analog output range of the operational amplifier in the ADC cell at the second stage and thereafter |VO/VR2|≦0.5

As the ADC cell at the second stage and thereafter, the ADC cell 103 in FIG. 22 can be used. In the ADC cell 103 at the second stage and thereafter in the above case, when the reference voltage VR is set as VR2, comparison levels of a 1.5-bit comparison circuit 2202 become +VR2/4 and −VR2/4, a digital code DB of a first logic operation circuit 2203 becomes DB0+DA×(01), and an analog output signal VO of an MDAC 2201 becomes 2×(VI−DA×(VR2/2)). Further, when the reference voltage VR of the ADC cell 102 at the initial stage is set as VR1, a relationship between VR2 and VR1 is set to satisfy VR2=VR1×A/2. According to this manner, the analog output range of the operational amplifier is limited by using the ADC cell 102 at the initial stage, and thereby an analog input range is limited in the ADC cell 103 at the second stage and thereafter, as a result, the pipeline type analog-digital converter can operate in a narrow range where the analog output range of the operational amplifier in the ADC cell 103 at the second stage and thereafter is also limited. That is, when KA is made ⅝≦KA≦¾ in the ADC cell 102 at the initial stage, the analog output range of the operational amplifier in the ADC cell 102 at the initial stage falls within ±0.75×VR2, and the analog output range of the operational amplifier in the ADC cell 103 at the second stage and thereafter can be made within ±0.5×VR2.

Figure 9:
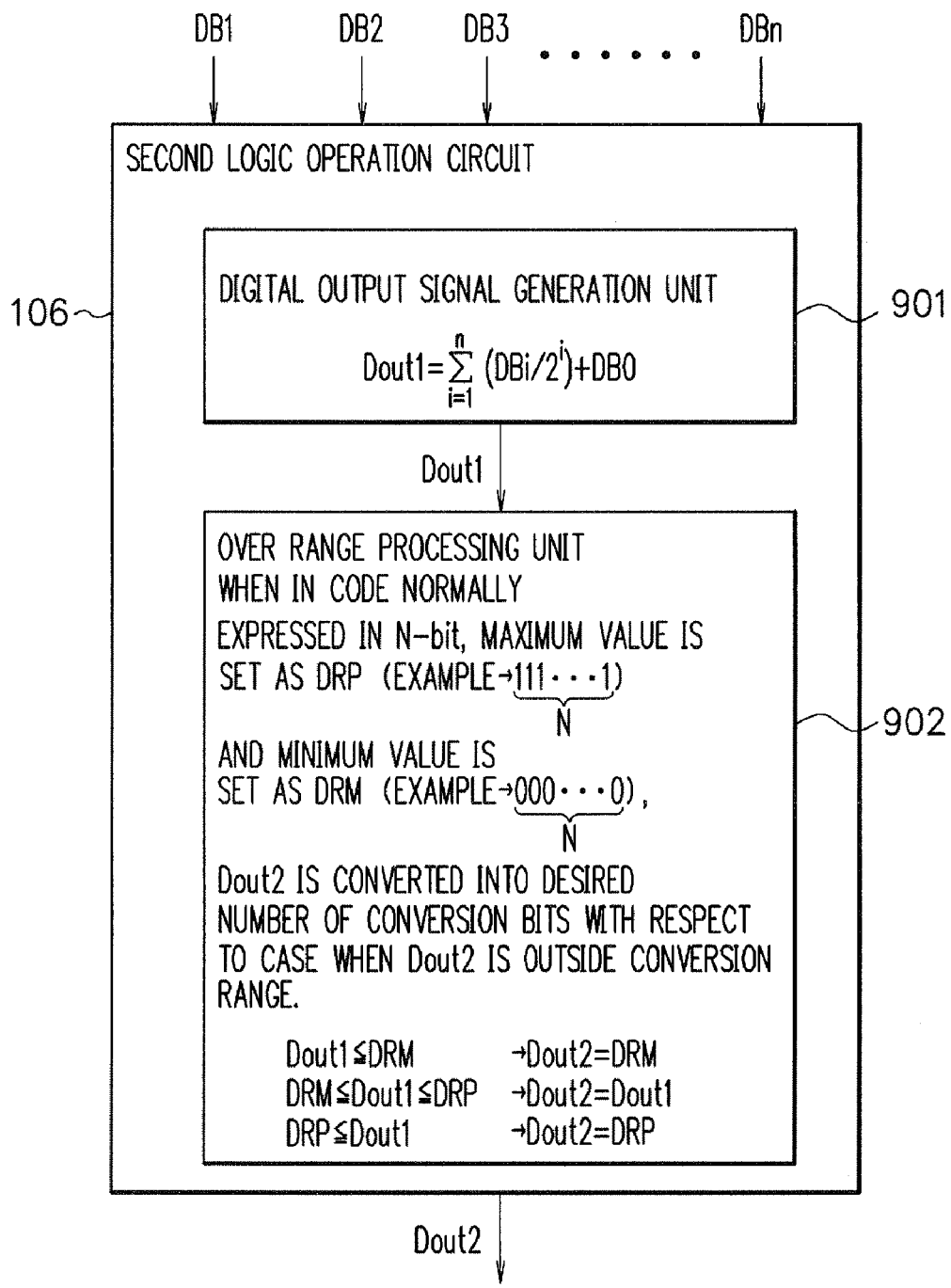
FIG. 9 is a view showing a configuration example of a second logic operation circuit.

FIG. 9 is a view showing a configuration example of the second logic operation circuit 106. The second logic operation circuit 106 has a digital output signal generation unit 901 and an over range processing unit 902, and receives the digital codes DB1 to DBn to output a digital output signal Dout2. The digital output signal Dout2 corresponds to the digital output signal Dout in FIG. 1.

As explained with reference to FIG. 6 and FIG. 7, the digital output signal generation unit 901 generates a digital output signal Dout1 based on the digital codes DB1 to DBn by the following formula of (6)

[Formula 3]

$$Dout1 = \sum_{i=1}^{n}(DBi/2^i) + DB0 \quad (6)$$

That is, the digital output signal generation unit 901 adds the digital codes DB1 to DBn, and furthermore adds DB0 in the case when the digital output signal Dout1 is made to be output only in a positive range. The constant DB0 may be 0.

The over range processing unit 902 performs over range processing for the digital output signal Dout1 to output an N-bit digital output signal Dout2. In the case when the first ADC cell 102 is used, there is sometimes a case that a digital output signal Dout1 in which the number of bits is equal to or more than N that is desired is output due to KA>1. The N-bit digital output signal Dout2 has a maximum value set as DRP and has a minimum value set as DRM. Normally, the maximum value DRP that can be expressed by N bits becomes "111 . . . 1" being a code in which 1 is continued until N digits. Similarly, the minimum value DRM is "000 . . . 0" being a code in which 0 is continued until N digits. If the digital output signal Dout1 is a value equal to or more than the maximum value DRP, the over range processing unit 902 makes the digital output signal Dout2 the maximum value DRP to output the digital output signal Dout2. Further, if the digital output signal Dout1 is a value equal to or less than the minimum value DRM, the over range processing unit 902 makes the digital output signal Dout2 the minimum value DRM to output the digital output signal Dout2. Further, if the digital output signal Dout1 is a value equal to or less than the maximum value DRP and equal to more than the minimum value DRM, the over range processing unit 902 outputs the digital output signal Dout1 as it is as the digital output signal Dout2.

Figure 10:
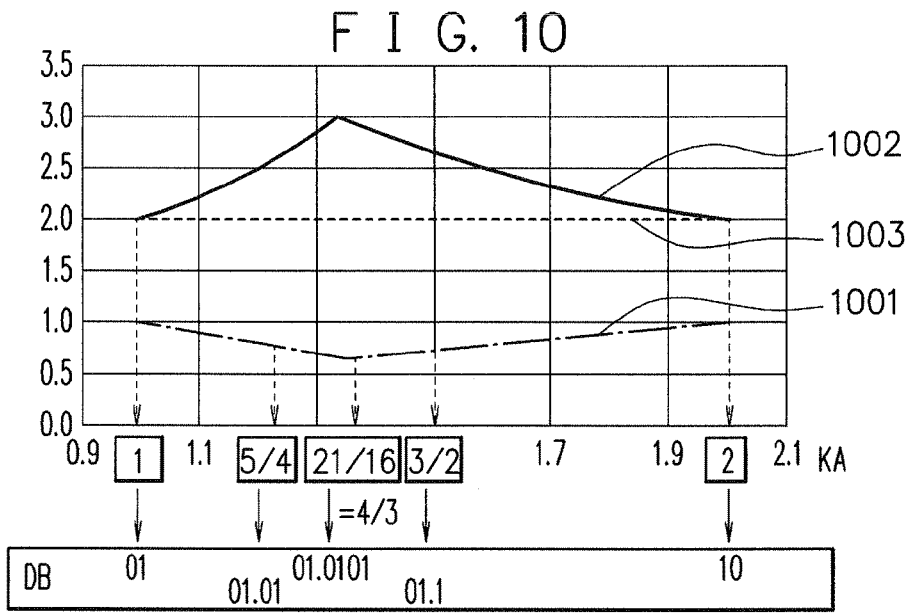
FIG. 10 is a characteristic view of the first ADC cell in accordance with a coefficient KA.

FIG. 10 is a characteristic view of the ADC cell 102 in accordance with a coefficient KA. A horizontal axis indicates the constant KA. A characteristic 1001 is VOF/VIF, a characteristic 1002 is R=DRF/VOF, and a characteristic 1003 is DRF/VIF. Here, the input signal full scale VIF is VIF=2VR due to ±VR. Further, the dynamic range full scale DRF becomes 2×((a maximum value of VI)−(a minimum value of VI))=4VR. Further, the operational amplifier full scale VOF is (a maximum value of VO)−(a minimum value of VO).

In the first ADC cell 102, decimal numbers are used for addition/subtraction of ±(VR/2) of a unit of ¼ (corresponding to two bits) with respect to the MDAC 201, and therefore an analog output signal VOi in an expression of (1) that is described above is made to be the analog output signal VO in the following expression of (7) to enable input/output characteristics in the MDAC 201 to be expressed by decimal numbers. Note that in the following expression, A represents an amplification factor, which is, for example, 2. KA represents a multiplication coefficient, and decimal numbers are managed to be used. The digital code DA is one of "−1, 0, +1". The digital code DB is a binary digital code made after the digital code DA is multiplied by KA as expressed in the following expression of (8).

$$VO = A \times (VI - DA \times KA \times (VR/2)) \quad (7)$$

$$DB = DA \times KA \quad (8)$$

Figure 30:
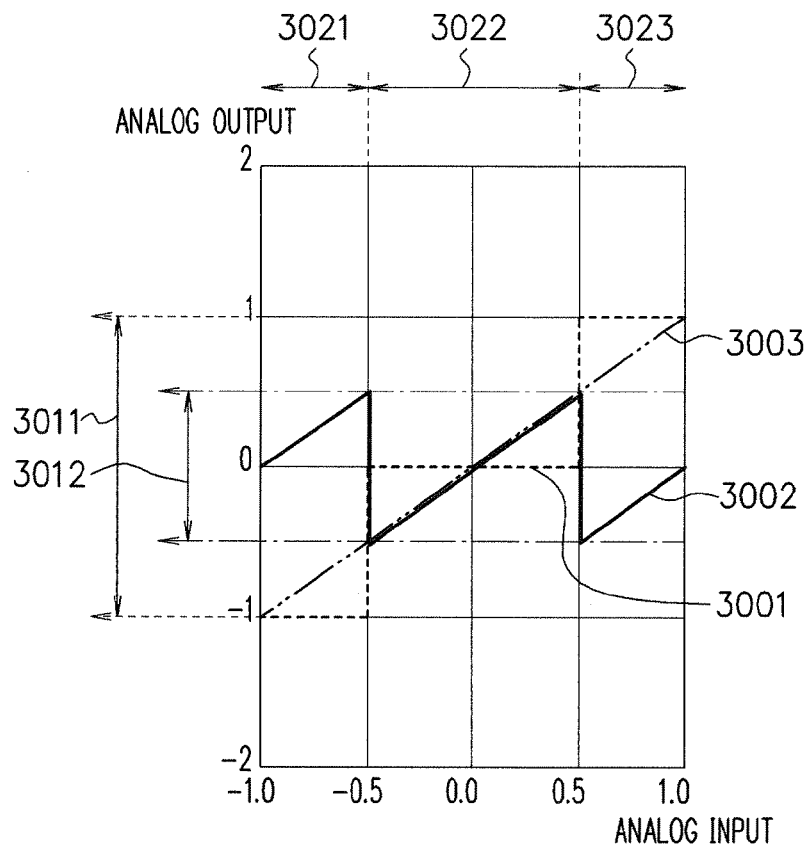
FIG. 30 is a view showing a dynamic range and an output range of an operational amplifier in an ADC cell in Patent Document 1 at an initial stage.
Figure 31:
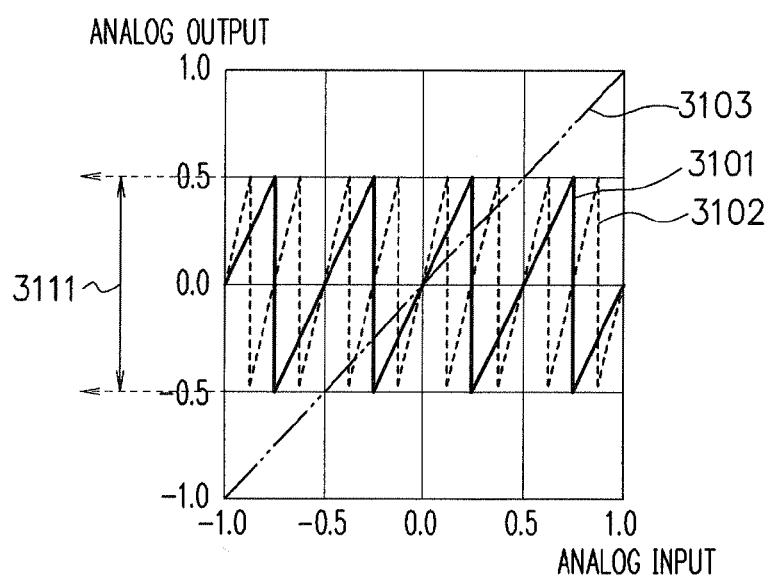
FIG. 31 is a view showing an output range of the ADC cell in FIG. 22 at the second stage and thereafter.

In the second ADC cell 103, A is equal to 2 and KA is equal to 1. In an ADC cell in FIG. 30, A is equal to 1 and KA is equal to 2. In the first ADC cell 102, the case of KA=5/4 is explained as an example as above, but when KA is set as a decimal number of 1<KA<2, a signal amplitude can be expanded. Particularly, when KA is set as the vicinity of 4/3 (21/16, for example), widths of three areas in the analog output signal VO become equal, and even in the case of A=2, it makes it possible to reduce the analog output range of the operational amplifier to |VO/VR|≦(2/3)R.

Figure 11:
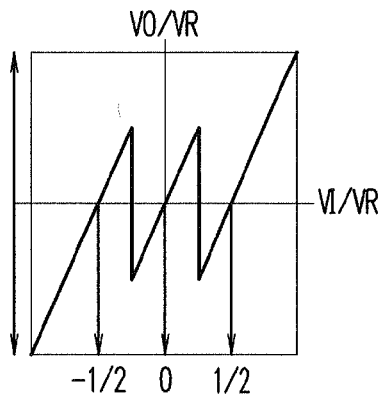
FIG. 11 is a graph showing a relationship between an analog input signal and an analog output signal in the ADC cell when the coefficient KA is 1.

FIG. 11 is a graph showing a relationship between the analog input signal VI/VR and the analog output signal VO/VR when the coefficient KA is 1. VOF/VIF in the characteristic 1001 is 1 and DRF/VIF in the characteristic 1003 is 2. KA is 1 (that is "01" in a binary number). The digital code DB is DA×KA=DA×(01).

Figure 12:
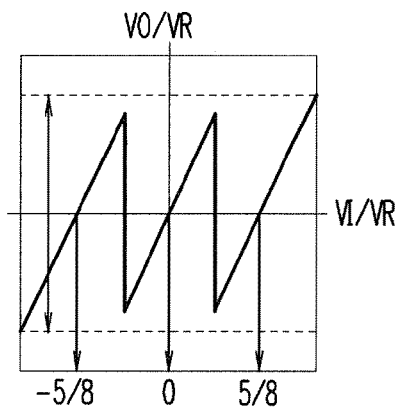
FIG. 12 is a graph showing a relationship between the analog input signal and the analog output signal in the ADC cell when the coefficient KA is ⁵⁄₄.

FIG. 12 is a graph showing a relationship between the analog input signal VI/VR and the analog output signal VO/VR when the coefficient KA is 5/4. VOF/VIF in the characteristic 1001 is 3/4 and DRF/VIF in the characteristic 1003 is 2. KA is 5/4 (that is "01.01" in a binary number). The digital code DB is DA×KA=DA×(01.01), and is represented by three values of +1.01, 0.00, and −1.01 in a binary number.

Figure 13:
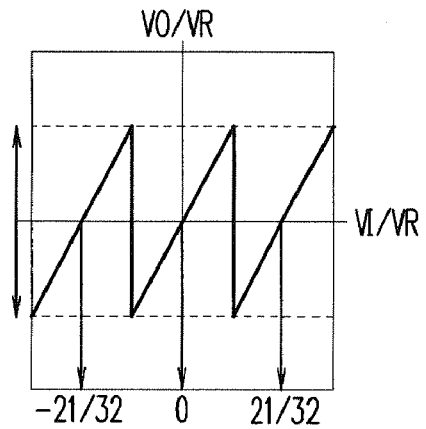
FIG. 13 is a graph showing a relationship between the analog input signal and the analog output signal in the ADC cell when the coefficient KA is ²¹⁄₁₆.

FIG. 13 is a graph showing a relationship between the analog input signal VI/VR and the analog output signal VO/VR when the coefficient KA is 21/16. VOF/VIF in the characteristic 1001 is 2/3 and DRF/VIF in the characteristic 1003 is 2. KA is 21/16 (that is "01.0101" in a binary number). The digital code DB is DA×KA=DA×(01.0101), and is represented by three values of +1.0101, 0.0000, and −1.0101 in a binary number.

Figure 14:
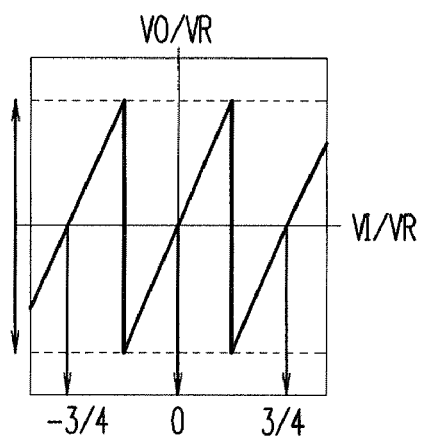
FIG. 14 is a graph showing a relationship between the analog input signal and the analog output signal in the ADC cell when the coefficient KA is ½.

FIG. 14 is a graph showing a relationship between the analog input signal VI/VR and the analog output signal VO/VR when the coefficient KA is 3/2. VOF/VIF in the characteristic 1001 is 3/4 and DRF/VIF in the characteristic 1003 is 2. KA is 3/2 (that is "01.1" in a binary number). The digital code DB is DA×KA=DA×(01.1), and is represented by three values of +1.1, 0.0, and −1.1 in a binary number.

Figure 15:
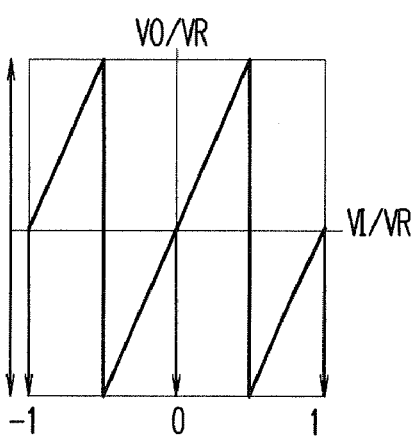
FIG. 15 is a graph showing a relationship between the analog input signal and the analog output signal in the ADC cell when the coefficient KA is 2.

FIG. 15 is a graph showing a relationship between the analog input signal VI/VR and the analog output signal VO/VR when the coefficient KA is 2. VOF/VIF in the characteristic 1001 is 1 and DRF/VIF in the characteristic 1003 is 2. KA is 2 (that is "10" in a binary number). The digital code DB is DA×KA=DA×(10).

When the case of A=2 is considered, (DRF/VIF) in the characteristic 1003 is 2, which is constant, because the dynamic range is such that the input is doubled. Here, the analog output range of the operational amplifier when KA is changed in a range of 1 to 2 will be explained. It is found that when KA is 1 and 2, (VOF/VIF) in the characteristic 1001 is 1, and on the other hand, when KA is in a range of 1<KA<2, it is possible to make (VOF/VIF) in the characteristic 1001 less than 1. That is, it is possible to make the ratio R (=DRF/VOF) in the characteristic 1002 larger than 2. When KA is equal to the vicinity of 4/3 (21/16, for example), (VOF/VIF) in the characteristic 1001 becomes 2/3 and the ratio R in the characteristic 1002 becomes 3. The ratio R that is R=3 is improved 1.5 times the ratio R that is R=2 when KA is 1 and 2. This means that the analog input signal VI and the reference voltage VR are enabled to be 1.5 times larger respectively when the analog output range of the operational amplifier is considered to be constant. Similarly, in the case of KA=5/4 and KA=3/2, VOF/VOR in the characteristic 1001 becomes 3/4 and the ratio R in the characteristic 1002 becomes 8/3. The ratio R that is R=8/3 is improved 4/3 times more compared with the ratio R that is R=2 when KA is 1 and 2.

Further, it is necessary that the digital code DB can be expressed in a binary number. When KA is a value of 5/4 and 3/2, a denominator of the value is the nth power of 2, and therefore the digital code DB can be expressed in a binary number easily. When KA is a value of 2/3, the digital code DB becomes "1.01010101 . . . " in a binary number accurately, and therefore it is difficult for the digital code DB to be expressed in a binary number. However, truncation at significant digits of the digital output signal Dout2 is possible. Actually, even in the case of KA=$^{21}/_{16}$ and DB="1.0101", VOF/VIR in the characteristic 1001 is $^{21}/_{32}$, which becomes approximately $^{2}/_{3}$.

Figure 16:
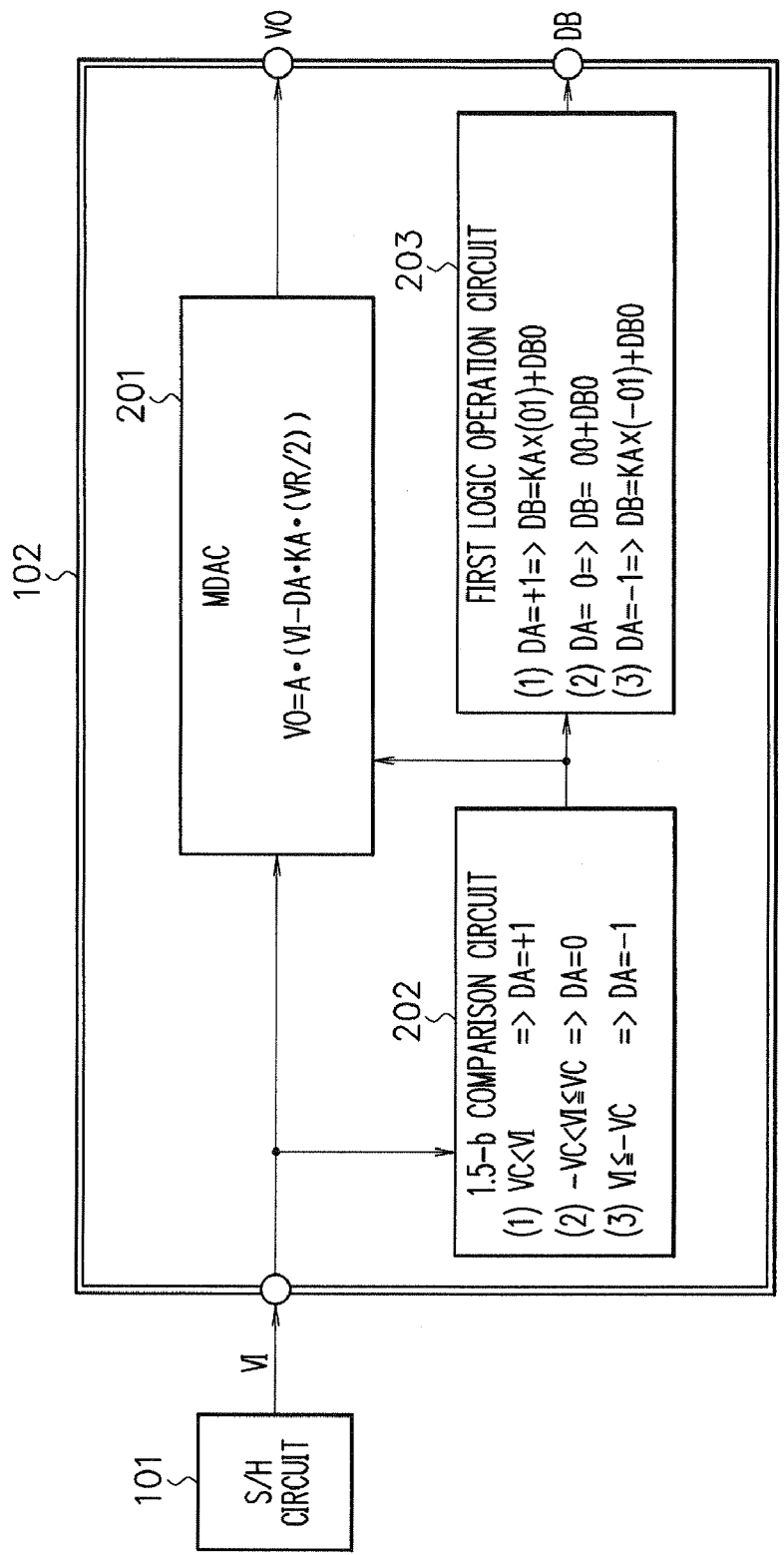
FIG. 16 is a view of a rough configuration of the first ADC cell in FIG. 2.
Figure 20:
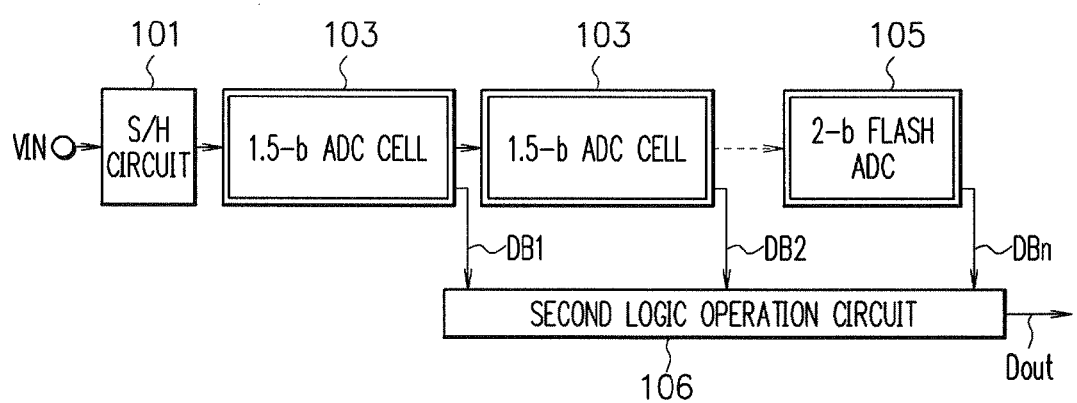
FIG. 20 is a view showing a configuration example of a conventional pipeline type analog-digital converter.
Figure 21:
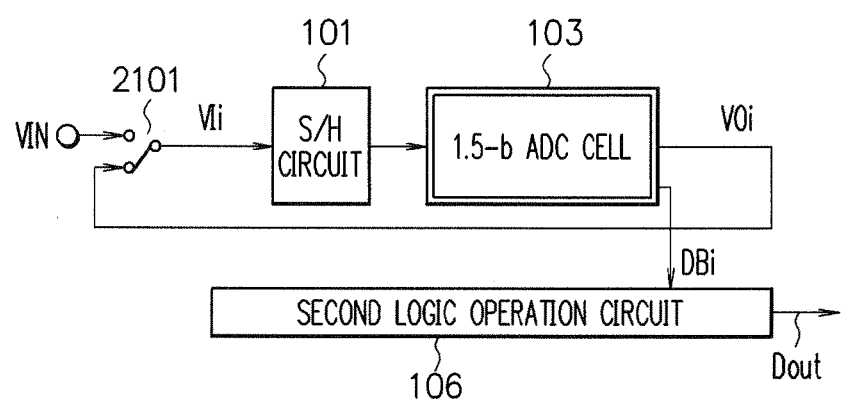
FIG. 21 is a view showing a configuration example of a conventional cycle type analog-digital converter.

FIG. 16 is a view of a rough configuration of the first ADC cell 102 in FIG. 2. The first ADC cell 102 receives the analog input signal VI from the sample and hold circuit 101 to output the analog output signal VO and the digital code DB.

The 1.5-bit comparison circuit 202 makes the digital code DA "+1" to output the digital code DA when the analog input signal VI is larger than a first comparison level (+VC), the 1.5-bit comparison circuit 202 makes the digital code DA "0" to output the digital code DA when the analog input signal VI is equal to or less than the first comparison level (+VC) and larger than a second comparison level (−VC), and the 1.5-bit comparison circuit 202 makes the digital code DA "−1" to output the digital code DA when the analog input signal VI is equal to or less than the second comparison level (−VC). Here, VC is VC=KA×VR/4.

The first logic operation circuit 203 outputs the second digital code DB represented by three values, which is expressed by DB=DA×KA+DB0, based on the first digital code DA. Concretely, the first logic operation circuit 203 makes the digital code DB set as KA×(+01)+DB0 to output the second digital code DB when the digital code DA is "+1", the first logic operation circuit 203 makes the digital code DB set as (00)+DB0 to output the second digital code DB when the digital code DA is "0", and the first logic operation circuit 203 makes the digital code DB set as KA×(−01)+DB0 to output the second digital code DB when the digital code DA is "−1".

The MDAC (analog operation circuit) 201 outputs the analog output signal VO expressed by VO=A×(VI−DA×KA× (VR/2)) based on the first digital code DA and the analog input signal VI. A and VR are constants.

Here, the ADC cell 102 can perform an appropriate analog-digital conversion when the analog input signal VI is within a range of equal to or more than +VR and equal to or less than −VR. The constant KA is a decimal number satisfying a condition of 1<KA<2, and preferably is a decimal number that is equal to or more than $^{5}/_{4}$ and equal to or less than $^{3}/_{2}$. A is, for example, 2.

FIG. 17 is a view showing a configuration example of a pipeline type analog-digital converter according to another embodiment of the present invention. A sample and hold circuit 101 samples and holds an external analog input signal VIN to output it to a 1.5-bit ADC cell 102. The plural first 1.5-bit ADC cells 102 are connected in series. The first ADC cell 102 has the configuration in FIG. 2 and receives the external analog input signal VIN or an analog output signal that the ADC cell 102 at the preceding stage outputs as an analog input signal and converts the analog input signal into a digital code DB1, a digital code DB2, represented by three values (1.5 bits), or the like to output an analog output signal being a quantization error to the ADC cell 102 at a subsequent stage. A 2-bit flash ADC 105 converts the analog output signal of the ADC cell 102 at a final stage into a 2-bit digital code DBn. A second logic operation circuit 106 outputs a digital output signal Dout based on the digital codes DB1 to DBn. Note that another embodiment of the present invention is not limited to the above-described configuration, and the 2-bit flash ADC 105 may be set as a 3-bit or more flash ADC.

FIG. 18 is a view showing a configuration example of a cycle type analog-digital converter according to another embodiment of the present invention. A sample and hold circuit 101 samples and holds an analog input signal VIi to output it to a switch 1802. Here, i represents a stage number. The switch 1802 connects an output terminal of the sample and hold circuit 101 to a first 1.5-bit ADC cell 102 or a second 1.5-bit ADC cell 103. The first ADC cell 102 has the configuration in FIG. 2 and converts an analog input signal into a digital code DBi represented by three values (1.5 bits) to output an analog output signal VOi being a quantization error thereof. The second ADC cell 103 has the configuration in FIG. 22 and converts an analog input signal into a digital code DBi represented by three values (1.5 bits) to output an analog output signal VOi being a quantization error thereof. A switch 1803 outputs the analog output signal VOi of either the first ADC cell 102 or the second ADC cell 103. A switch 1801 connects an input terminal of the sample and hold circuit 101 to either an output terminal of the switch 1803 or a terminal of an external analog input signal VIN. At a first cycle, the switch 1801 connects the terminal of the external analog input signal VIN and the input terminal of the sample and hold circuit 101, the switch 1802 connects the output terminal of the sample and hold circuit 101 and an analog input terminal of the first ADC cell 102, and the switch 1803 connects an analog output terminal of the first ADC cell 102 to the switch 1801. The first ADC cell 102 receives the external analog input signal VIN as the analog input signal VIi and outputs the digital code DBi and the analog output signal VOi. Here, i is 1. At a second cycle and thereafter, the switch 1801 connects the output terminal of the switch 1803 and the input terminal of the sample and hold circuit 101, the switch 1802 connects the output terminal of the sample and hold circuit 101 and an analog input terminal of the second ADC cell 103, and the switch 1803 connects an analog output terminal of the second ADC cell 103 to the switch 1801. The second ADC cell 103 receives an analog output signal VOi−1 at the preceding stage as the analog input signal VIi and outputs the digital code DBi and the analog output signal VOi. Thereafter, by performing cycle processing, digital codes DB1, DB2, . . . can be obtained. A second logic operation circuit 106 outputs a digital output signal Dout based on the digital codes DB1, DB2, . . . . Note that here, the first ADC cell 102 and the second ADC cell 103 only need to satisfy an analog operation and a digital conversion (which will be called a "conversion operation" hereinafter). Hereinafter, there will be explained a method in which every time the cycle processing is performed, a parameter KA in the comparators, the Sub DAC, and the first logic operation circuit is switched in FIG. 2, and thereby the conversion operation of the second ADC cell 103 is performed by using the first ADC cell 102. Accordingly, in the first ADC cell 102 and the second ADC cell 103, most components of the ADC cells are made in common, thereby being used. For example, in the conversion operation at a first order, when KA is set as KA=$^{5}/_{4}$, reference voltages of +$^{5}/_{4}$× VR and −$^{5}/_{4}$×VR are input to the Sub DAC 215 and reference voltages of +$^{5}/_{16}$×VR and −$^{5}/_{16}$×VR are input to the comparator 221 and the comparator 222. Then, the first logic operation circuit 231 outputs "+01.01", "00.00", "−01.01" as the second digital code DB respectively when the first digital code DA is "+1", "0", and "−1". In the conversion operation at a second order and thereafter, when KA is set as KA=1, reference voltages of +VR and −VR are input to the Sub DAC 215 and reference voltages of +$^{1}/_{4}$×VR and −$^{1}/_{4}$×VR are input to the comparator 221 and the comparator 222. Then, the first logic operation circuit 231 outputs "+01.00", "00.00", "−01.00" as the second digital code DB respectively when the first digital code DA is "+1", "0", and "−1". That is, at the time of the conversion operation of the first ADC cell, ±($^{5}/_{4}$)VR are applied as the reference voltage, at the time of the conversion operation of the second ADC cell, ±VR are applied as the reference voltage, and further the output code of the first logic operation circuit is switched, and thereby it is possible to make most of the components of the ADC cells in common to be used. Here, the cycle type analog-digital converter is one type of a successive approximation type analog-digital converter and has a characteristic such that speed is slow but a circuit scale is small and a high resolution can be achieved easily.

FIG. 19 is a view showing a configuration example of a cycle type analog-digital converter according to another embodiment of the present invention. A sample and hold circuit 101 samples and holds an analog input signal VIi to output it to a first 1.5-bit ADC cell 102. Here, i represents a stage number. The 1.5-bit ADC cell 102 has the configuration in FIG. 2 and converts the analog input signal VIi into a digital code DBi represented by three values (1.5 bits) to output an analog output signal VOi being a quantization error thereof. A switch 1901 connects an input terminal of the sample and hold circuit 101 to either a terminal of the analog output signal VOi or a terminal of an external analog input signal VIN. At first, the switch 1901 connects the terminal of the external analog input signal VIN and the input terminal of the sample and hold circuit 101. The ADC cell 102 receives the external analog input signal VIN as the analog input signal VIi to output the digital code DBi and the analog output signal VOi. Here i is 1. Next, the switch 1901 connects the terminal of the analog output signal VOi and the input terminal of the sample and hold circuit 101. The ADC cell 102 receives an analog output signal VO1 as an analog input signal VI2 to output a digital code DB2 and an analog output signal VO2. Thereafter, by performing cycle processing, the ADC cell 102 outputs the plural digital codes DB1, DB2, . . . at different timings. A second logic operation circuit 106 outputs a digital output signal Dout based on the plural digital codes DB1, DB2, . . . .

According to the above-described embodiments, it is possible to reduce an analog output range (VOF/VIR) of an operational amplifier with respect to the same dynamic range. For example, when KA is 1, the analog output range (VOF/VIR) is 1, on the other hand, when KA is the vicinity of 4/3, the analog output range (VOF/VIR) can be reduced to 2/3. The analog output range of the operational amplifier depends on an operation power supply voltage. The analog output range of the operational amplifier is considered to be in proportion to the operation power supply voltage for simple consideration. When the analog output range of the operational amplifier becomes 2/3, the power supply voltage can be reduced by a factor of 2/3, which becomes an effective measure in a miniaturization process. In the above case, the dynamic range does not change itself, and therefore a capacitance value may also be the same as that in the ADC cell 103 in FIG. 22, and thus a power supply current also becomes the same. Accordingly, when it is considered with respect to power consumption, the power consumption can be reduced by an amount equal to a reduction amount of the power supply voltage, namely by a factor of 2/3.

As described above, the ADC cell 102 can reduce the analog output range of the operational amplifier without the dynamic range of the signal being damaged. Further, only by using the ADC cell 102 only at the initial stage, a performance improvement of the ADC cell 103 at the second stage and thereafter can be achieved simultaneously.

Further, in the case when it is considered with respect to the same power supply voltage and the same analog output range of the operational amplifier, the dynamic range can be expanded by a factor of up to 3/2. If the signal amplitude is made by a factor of 3/2, an allowable value of noise itself can also be reduced by a factor of up to 3/2. The capacitance value is in inverse proportion to a square of an allowable noise, and therefore the capacitance value can be reduced by a factor of 4/9. The power supply current is in proportion to the capacitance value, and therefore the power supply current can also be reduced by a factor of 4/9. That is, the ADC cell 102 according to the embodiment can reduce the power consumption to approximately half with the same power supply voltage and an improvement effect is significant. Further, miniaturization by the reduction of the capacitance value is possible.

Figure 32:
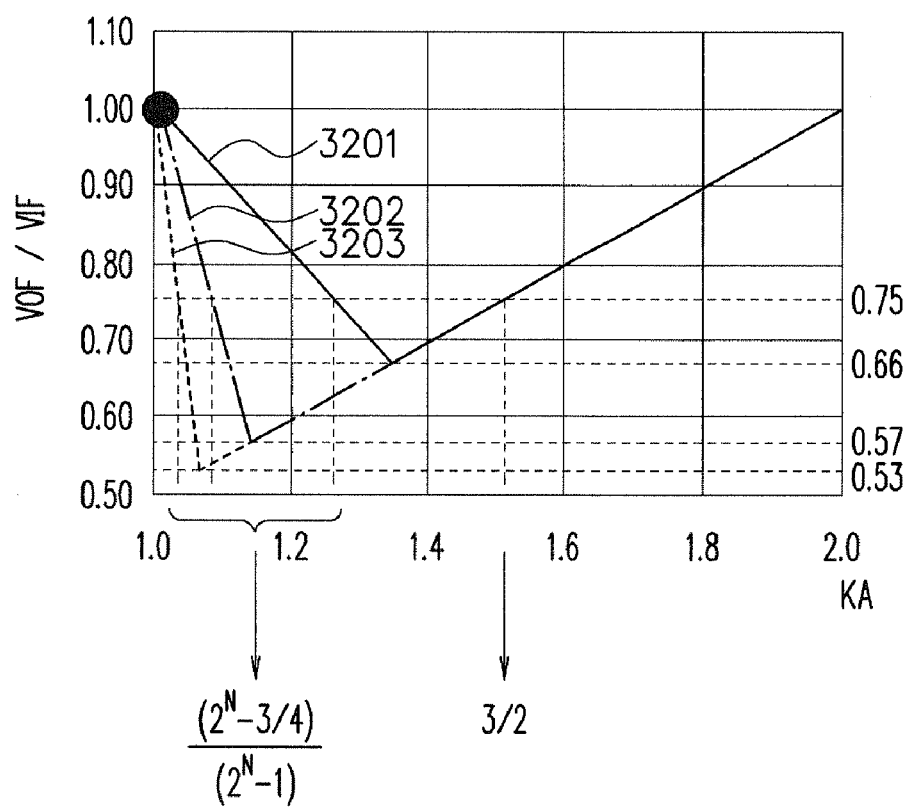
FIG. 32 is a view showing a relationship between values of KA in the 1.5-bit ADC cell, a 2-bit ADC cell, and a 3-bit ADC cell and a ratio of an input signal full scale VIF to an output signal full scale VOF.

FIG. 32 is a view showing a relationship between the values of KA of 1.5-bit, 2-bit, and 3-bit ADC cells and a ratio of the input signal full scale VIF to an output signal full scale VOF. The case of the 1.5-bit ADC cell is explained above, but hereinafter an N-bit (where N is a natural number) ADC cell will be explained. The 1.5-bit ADC cell by 1-bit determination, has two areas for one bit and a single redundant area (which is an area that is equal to or less than +KA/4 and larger than −KA/4, namely an area that is DA=0), and therefore the three areas constitute the 1.5-bit ADC cell. Thus, N of the 1.5-bit ADC cell is 1. A characteristic 3201 is a characteristic of the above-described 1.5-bit ADC cell (where the comparison circuit 202 compares in the three areas). A characteristic 3202 is a characteristic of the 2-bit ADC cell (where a comparison circuit compares in five or seven areas). A characteristic 3203 is a characteristic of the 3-bit ADC cell (where a comparison circuit compares in nine, 11, 13, or 15 areas).

In the above-described expressions of (7) and (8), the analog output signal VO and the digital code DB of the 1.5-bit ADC cell are expressed. On the other hand, an analog output signal VO and a digital code DB of the N-bit ADC cell are expressed by the following expressions of (9) and (10). Here, a constant A is preferable to be $2^N$, but it may also be a value except $2^N$.

$$VO = A \times (VI - DA \times KA \times (VR/A)) \quad (9)$$

$$DB = DA \times KA \quad (10)$$

In the characteristics 3201, 3202, and 3203, by making KA a decimal value that is larger than 1 and less than 2, it is possible to make VOF/VIF smaller than 1 and make the output signal full scale VOF smaller with respect to the input signal full scale VIF.

In the characteristic 3201, when KA is 1, VOF/VIF is 1, and when KA is 2, VOF/VIF is 1, and a minimum value of VOF/VIF is 0.66.

In the characteristic 3202, when KA is 1, VOF/VIF is 1, and when KA is 2, VOF/VIF is 1, and a minimum value of VOF/VIF is 0.57.

In the characteristic 3203, when KA is 1, VOF/VIF is 1, and when KA is 2, VOF/VIF is 1, and a minimum value of VOF/VIF is 0.53.

It is found that when KA is 1<KA<2, VOF/VIF is reduced as described above. As a resolution (the number of bits) of the ADC cell is increased more, a reduction effect of VOF/VIF is improved more, and the ratio of the input signal full scale VIF to the output signal full scale VOF comes closer to 0.5.

Further, if an absolute value of VO/VR (VOF/VIF) of the ADC cell at the initial stage is made equal to or less than 3/4 (=0.75) as shown in FIG. 4, an absolute value of VO/VR of the ADC cell at the second stage and thereafter can be made equal to or less than 0.5.

In the case when the number of areas is an odd number, if KA is equal to or more than $(2^N - 3/4)/(2^N - 1)$ and equal to or less than ½, it is possible to make VOF/VIF equal to or less than 0.75. In the characteristic 3201, it is possible to make VOF/VIF equal to or less than 0.75 in a range where KA is equal to or more than ⅝ and equal to or less than ½. In the characteristic 3202, it is possible to make VOF/VIF equal to or less than 0.75 in a range where KA is equal to or more than ¹³⁄₁₂ and equal to or less than ½. In the characteristic 3203, it is possible to make VOF/VIF equal to or less than 0.75 in a range where KA is equal to or more than ²⁹⁄₂₈ and equal to or less than ½.

Figure 33:
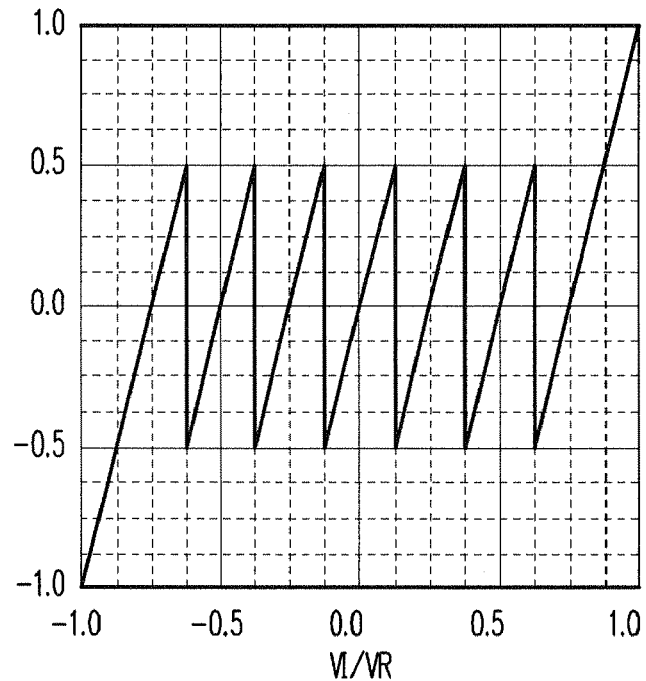
FIG. 33 is a view showing input/output characteristics of the 2-bit ADC cell (where a comparison circuit compares in seven areas) when KA is 1.
Figure 34:
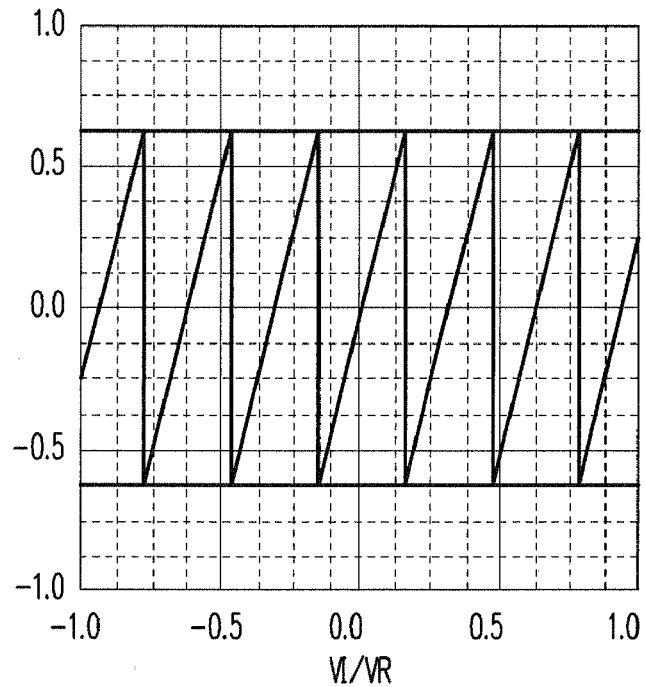
FIG. 34 is a view showing input/output characteristics of the 2-bit ADC cell (where the comparison circuit compares in seven areas) when KA is 1.25.
Figure 35:
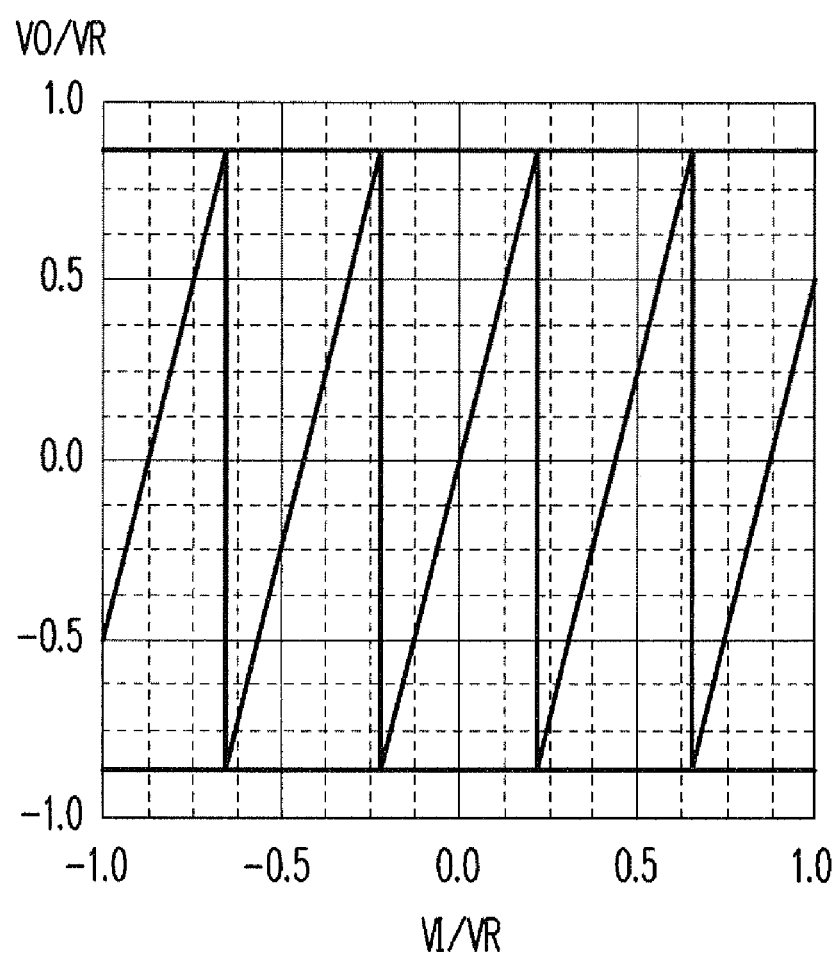
FIG. 35 is a view showing input/output characteristics of the 2-bit ADC cell (where the comparison circuit compares in five areas) when KA is 1.75.

FIG. 33 to FIG. 35 show input/output characteristics of the 2-bit ADC cell (where the comparison circuit compares in five or seven areas), and correspond to the characteristic 3202 in FIG. 32. A horizontal axis indicates VI/VR and a vertical axis indicates VO/VR.

FIG. 33 is a view showing the input/output characteristics of the 2-bit ADC cell (where the comparison circuit compares in seven areas) when KA is 1. AS for VO/VR, a maximum value is 1 and a minimum value is −1.

FIG. 34 is a view showing the input/output characteristics of the 2-bit ADC cell (where the comparison circuit compares in seven areas) when KA is 1.25. AS for VO/VR, a maximum value is 0.625 and a minimum value is −0.625.

FIG. 35 is a view showing the input/output characteristics of the 2-bit ADC cell (where the comparison circuit compares in five areas) when KA is 1.75. AS for VO/VR, a maximum value is 0.875 and a minimum value is −0.875.

As shown in FIG. 33 to FIG. 35, when KA is increased from 1, the number of areas changes from 7 to 5 in the middle. In FIG. 33 and FIG. 34, the number of areas is 7, and the number of areas is 5 in FIG. 35.

Figure 36:
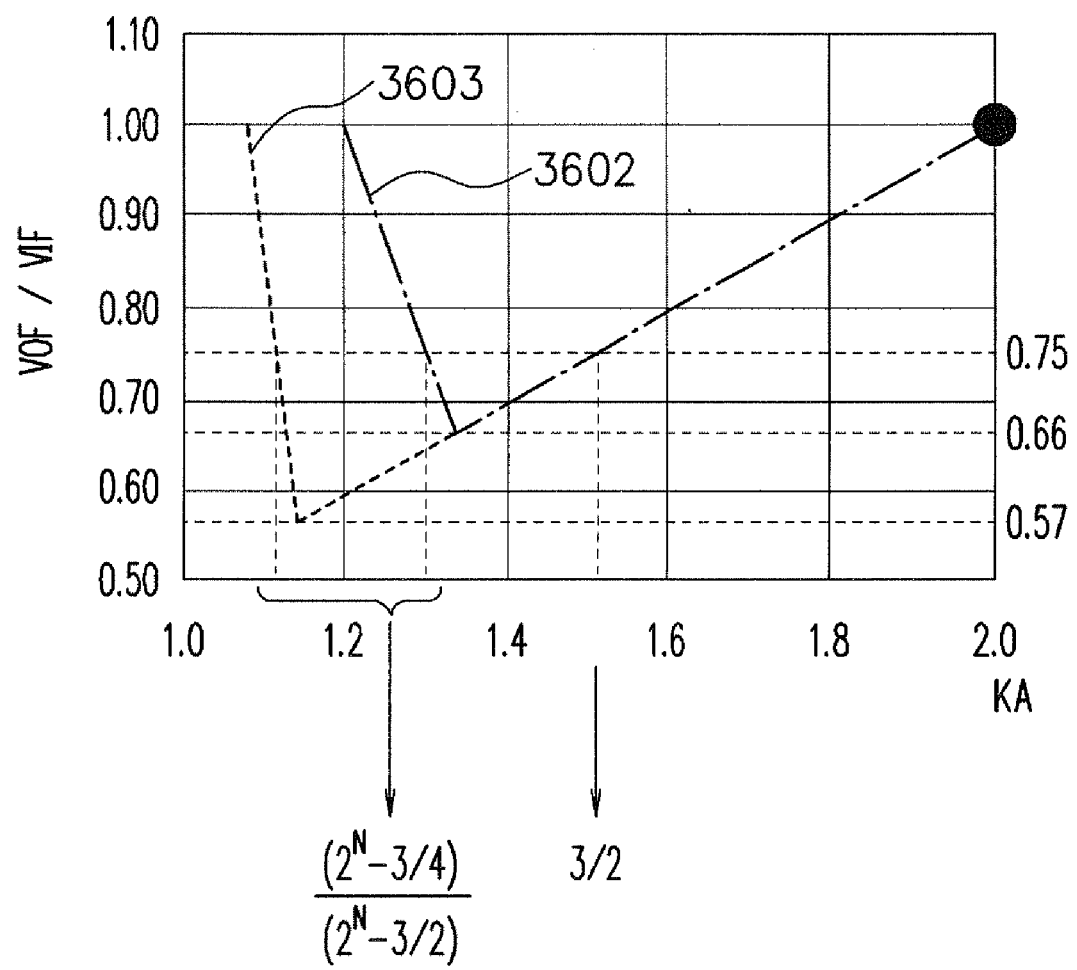
FIG. 36 is a view showing a relationship between the values of KA in the 2-bit ADC cell and the 3-bit ADC cell (where comparison circuits compare in an even areas) and the ratio of the input signal full scale VIF to the output signal full scale VOF.

FIG. 36 is a view showing a relationship between the values of KA of the 2-bit and 3-bit ADC cells (where the comparison circuits compare in even areas) and the ratio of the input signal full scale VIF to the output signal full scale VOF. A characteristic 3602 is a characteristic of the 2-bit ADC cell (where the comparison circuit compares in four or six areas). A characteristic 3603 is a characteristic of the 3-bit ADC cell (where the comparison circuit compares in eight, 10, 12 or 14 areas).

In the characteristics 3602 and 3603, by making KA a decimal value that is larger than 1 and less than 2, it is possible to make VOF/VIF smaller than 1 and make the output signal full scale VOF smaller with respect to the input signal full scale VIF.

In the characteristic 3602, when KA is 2, VOF/VIF is 1, and a minimum value of VOF/VIF is 0.66.

In the characteristic 3603, when KA is 2, VOF/VIF is 1, and a minimum value of VOF/VIF is 0.57.

It is found that when KA is 1<KA<2, VOF/VIF is reduced as described above. As a resolution (the number of bits) of the ADC cell is increased more, a reduction effect of VOF/VIF is improved more, and the ratio of the input signal full scale VIF to the output signal full scale VOF comes closer to 0.5.

Further, if the absolute value of VO/VR (VOF/VIF) of the ADC cell at the initial stage is made equal to or less than ¾ (=0.75) as shown in FIG. 4, the absolute value of VO/VR of the ADC cell at the second stage and thereafter can be made equal to or less than 0.5.

In the case when the number of areas is an even number, if KA is equal to or more than $(2^N-¾)/(2^N-½)$ and equal to or less than ½, it is possible to make VOF/VIF equal to or less than 0.75. In the characteristic 3602, it is possible to make VOF/VIF equal to or less than 0.75 in a range where KA is equal to or more than ¹³⁄₁₀ and equal to or less than ½. In the characteristic 3603, it is possible to make VOF/VIF equal to or less than 0.75 in a range where KA is equal to or more than ²⁹⁄₂₆ and equal to or less than ½.

Figure 37:
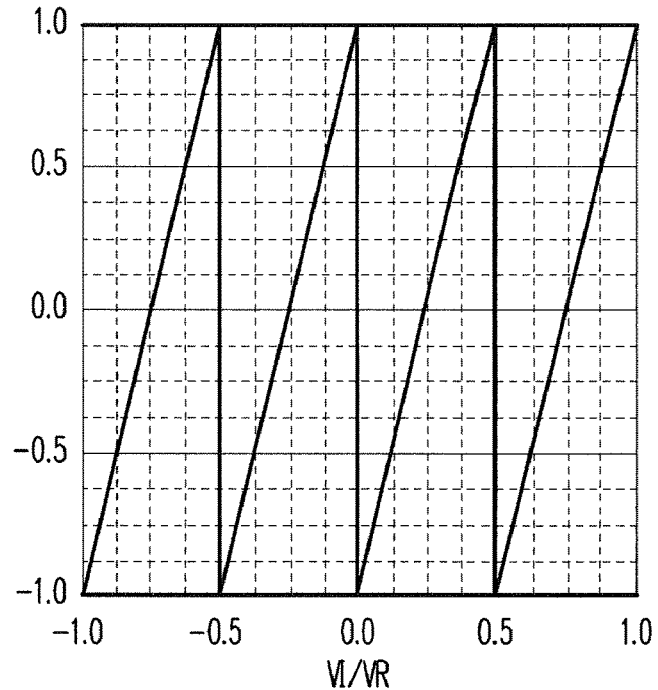
FIG. 37 is a view showing input/output characteristics of the 2-bit ADC cell (where the comparison circuit compares in four areas) when KA is 2.
Figure 38:
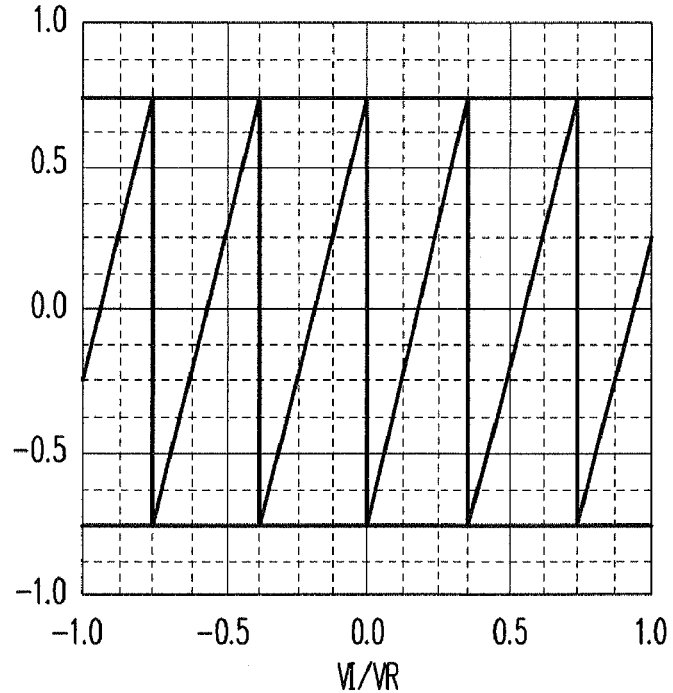
FIG. 38 is a view showing input/output characteristics of the 2-bit ADC cell (where the comparison circuit compares in six areas) when KA is 1.5.

FIG. 37 and FIG. 38 show input/output characteristics of the 2-bit ADC cell (where the comparison circuit compares in four or six areas), and correspond to the characteristic 3602 in FIG. 36. A horizontal axis indicates VI/VR and a vertical axis indicates VO/VR.

FIG. 37 is a view showing the input/output characteristics of the 2-bit ADC cell (where the comparison circuit compares in four areas) when KA is 2. AS for VO/VR, a maximum value is 1 and a minimum value is −1.

FIG. 38 is a view showing the input/output characteristics of the 2-bit ADC cell (where the comparison circuit compares in six areas) when KA is 1.5. AS for VO/VR, a maximum value is 0.75 and a minimum value is −0.75.

As shown in FIG. 37 and FIG. 38, when KA is increased from 1, the number of areas changes from 4 to 6 in the middle. In FIG. 37, the number of areas is 4, and the number of areas is 6 in FIG. 38.

FIG. 50 is a view showing a constitution and a characteristic of the N-bit ADC cell. A first row shows the N-bit ADC cell (where the number of areas is an odd number) in the case of KA=1, a second row shows the N-bit ADC cell (where the number of areas is an odd number) in the case of 1<KA<2, a third row shows the N-bit ADC cell (where the number of areas is an even number) in the case of KA=2, and a fourth row shows the N-bit ADC cell (where the number of areas is an even number) in the case of KA<2.

Q being the number of areas indicates the number of areas that the comparison circuit 202 in FIG. 2 compares. N is the number of bits being a natural number. In the case of the 1.5-bit ADC cell, for example, N is 1. The 1.5-bit ADC cell, by 1-bit determination, has two areas for one bit and a single redundant area (which is an area that is equal to or less than +KA/4 and is larger than −KA/4, namely an area that is DA=0). The number of comparisons indicates the number of the comparators 221 and 222 in the comparison circuit 202, and is Q−1. A comparison level is comparison levels used in the comparison circuit 202. The digital code DB and the analog output signal VO are the same as explained above.

In the embodiments, as explained in FIG. 32, a condition of 1<KA<2 is tried to be satisfied in the N-bit ADC cell (where the number of areas is an odd number) at the second row in FIG. 50. At this time, Q being the number of areas is equal to or more than $2^N+1$ and equal to or less than $2^{N+1}-1$. Further, the first digital code DA and the second digital code DB are selected from Q digital codes, and Q is the number of areas. The plural comparison levels (reference voltages) in the comparison circuit 202 are ±KA×VR× $C/2^{N+1}$, and C is ±1, ±3, ..., ±(Q−2) when Q being the number of areas is an odd number. The first digital code DA selected from Q digital codes, and the first digital code DA is 0, ±1, ±2, ..., ±(Q−1)/2 when Q being the number of areas is an odd number.

Further, in the embodiments, as explained in FIG. 36 above, a condition of KA<2 is tried to be satisfied in the N-bit ADC cell (where the number of areas is an even number) at the fourth row in FIG. 50. At this time, Q being the number of areas is equal to or more than $2^N+2$ and equal to or less than $2^{N+1}-2$. Further, the first digital code DA and the second digital code DB are selected from Q digital codes, and Q is the number of areas. The plural comparison levels (reference voltages) in the comparison circuit 202 are ±KA×VR× $C/2^{N+1}$, and C is 0, ±2, ±4, ..., ±(Q−2) when Q being the number of areas is an even number. The first digital code DA may be selected from Q digital codes, and the first digital code DA is ±½, ±³⁄₂, ..., ±(Q−3)/2 when Q being the number of areas is an even number.

In the embodiments, as explained in FIG. 32 and FIG. 36, VOF/VIF is reduced up to ½. Further, in the case of the dynamic range DRF in the ADC cell being $2^N$, when the ratio R of the dynamic range DRF to the output signal full scale VOF in the ADC cell is considered and VOF/VIF becomes ½, the ratio R can be improved to be double. In the embodiments, it is possible to make the ratio R (DRF/VOF) double in a multiple-bit ADC cell. That is, when the dynamic range DRF is $2^N$, the output signal full scale VOF can be made ½, and therefore it is possible to make the ratio R $2^{N+1}$.

Figure 47:
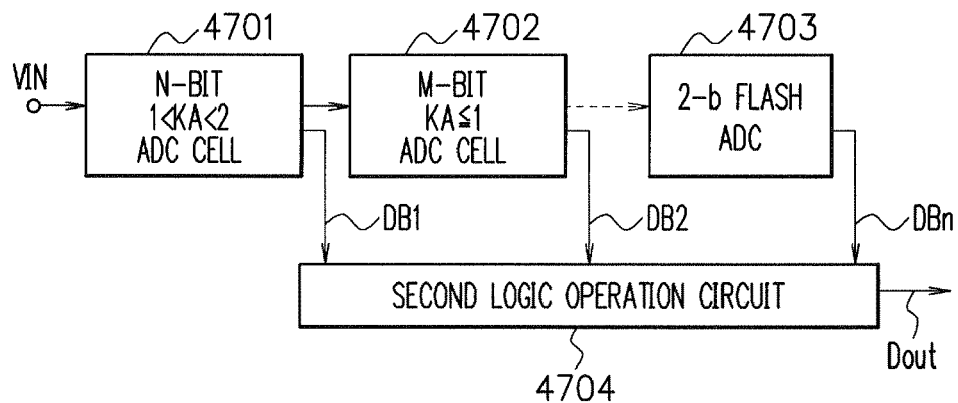
FIG. 47 is a view showing a configuration example of the pipeline type analog-digital converter using an N-bit ADC cell.

FIG. 47 is a view showing a configuration example of a pipeline type analog-digital converter using the N-bit ADC cell, and corresponds to FIG. 1. The analog-digital converter analog-digital converts an external analog input signal VI to output a digital output signal Dout. An N-bit ADC cell 4701 at an initial stage, a plurality of M-bit ADC cells 4702 at a second stage and thereafter and a 2-bit flash (parallel type) ADC 4703 at a final stage are connected in series. The ADC cell 4701, in which KA is a decimal value in a range that is larger than 1 and less than 2, receives an analog input signal VIN and converts the analog input signal into an N-bit digital code DB1 to output an analog output signal being a quantization error thereof to the ADC cell 4702 at a subsequent stage. Details thereof will be explained later. The ADC cell 4702, in which KA is a decimal value equal to or less than 1, receives the analog output signal output from the ADC cell 4701 at the preceding stage or the ADC cell 4702 at the preceding stage as an analog input signal and converts the analog input signal into an M-bit digital code DB2 or the like to output an analog output signal being a quantization error thereof to the ADC cell 4702 at a subsequent stage or the flash ADC 4703. The 2-bit flash ADC 4703 converts the analog output signal of the ADC cell 4702 at the preceding stage into a 2-bit digital code DBn. A second logic operation circuit 4704 similarly to the above, outputs the digital output signal Dout based on the digital codes DB1 to DBn. Further, the second logic operation circuit 4704 performs processing of the digital output signal generation unit 901 and the over range processing unit 902 shown in FIG. 9 as described above. The pipeline type analog-digital converter can perform a high-speed and highly accurate analog-digital conversion.

Note that the embodiments of the present invention are not limited to the above-described configuration, and the 2-bit flash ADC cell 4703 may be set as a 3-bit or more flash ADC cell. Further, similarly to that in FIG. 1, a sample and hold circuit 101 may be provided. Further, in the ADC cell 4702 as well, similarly to the ADC cell 4701, KA may also be set as a decimal value larger than 1 and less than 2. In this embodiment, KA in at least the single ADC cell only needs to be set as a decimal value larger than 1 and less than 2. Further, one of the ADC cells 4702 at the second stage and thereafter is preferable to be a 2-bit or more ADC cell.

Figure 39:
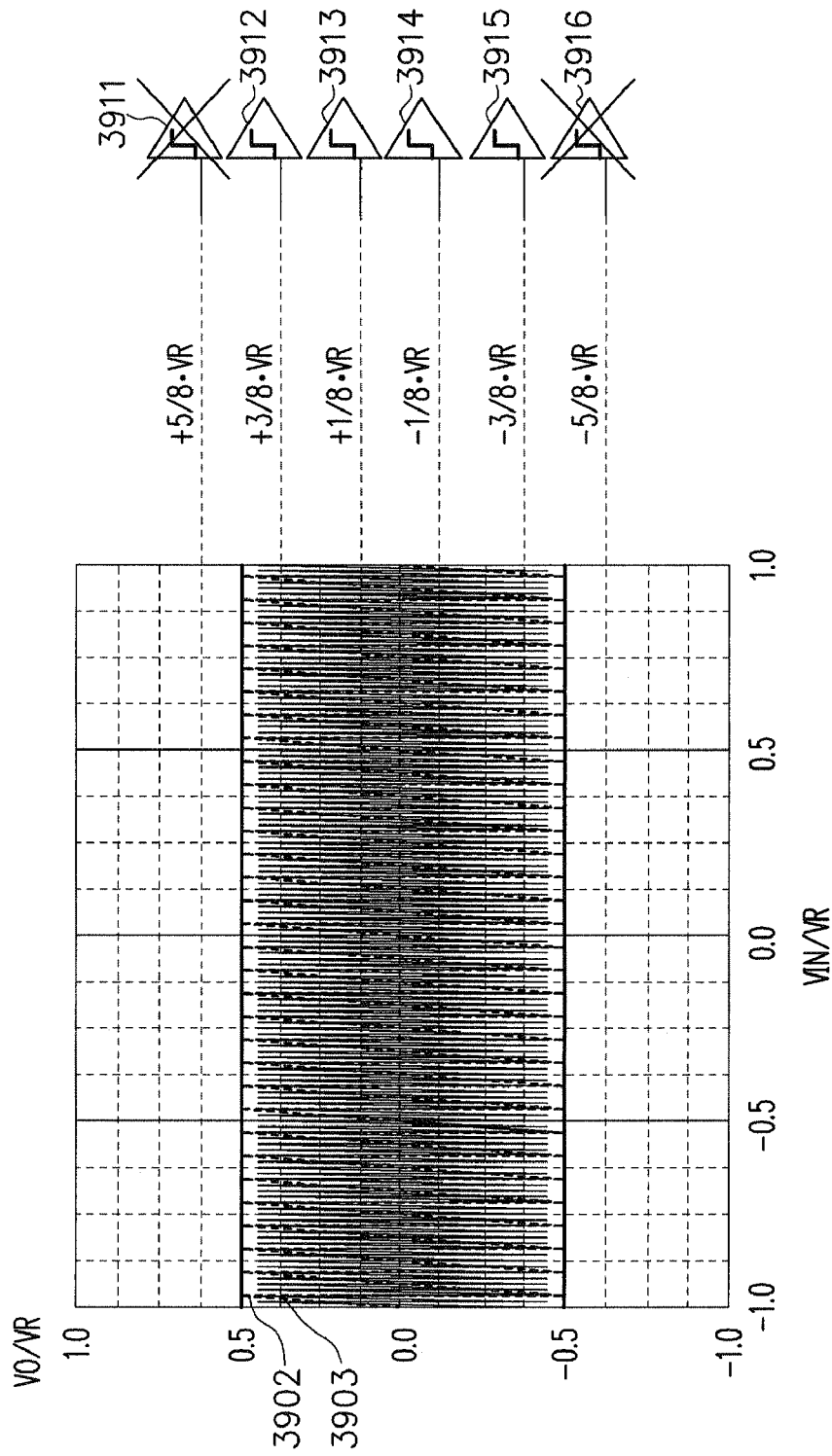
FIG. 39 is a view showing a characteristic of a pipeline type analog-digital converter in FIG. 47.

FIG. 39 is a view showing a characteristic of the pipeline type analog-digital converter in FIG. 47. The ADC cell 4701 at the initial stage is a 2-bit ADC cell (the number of areas is 7) with KA=1.25, and a characteristic thereof is the same as that shown in FIG. 34. The ADC cells 4702 at the second stage and thereafter are 2-bit ADC cells (the number of areas is 7) with KA=1.

In FIG. 39, a horizontal axis indicates VIN/VR and a vertical axis indicates VO/VR. A characteristic 3902 is a characteristic of the 2-bit ADC cell (the number of areas is 7, KA=1) 4702 at the second stage. A characteristic 3903 is a characteristic of the 2-bit ADC cell (the number of areas is 7, KA=1) 4702 at a third stage.

Figures 43, 44:
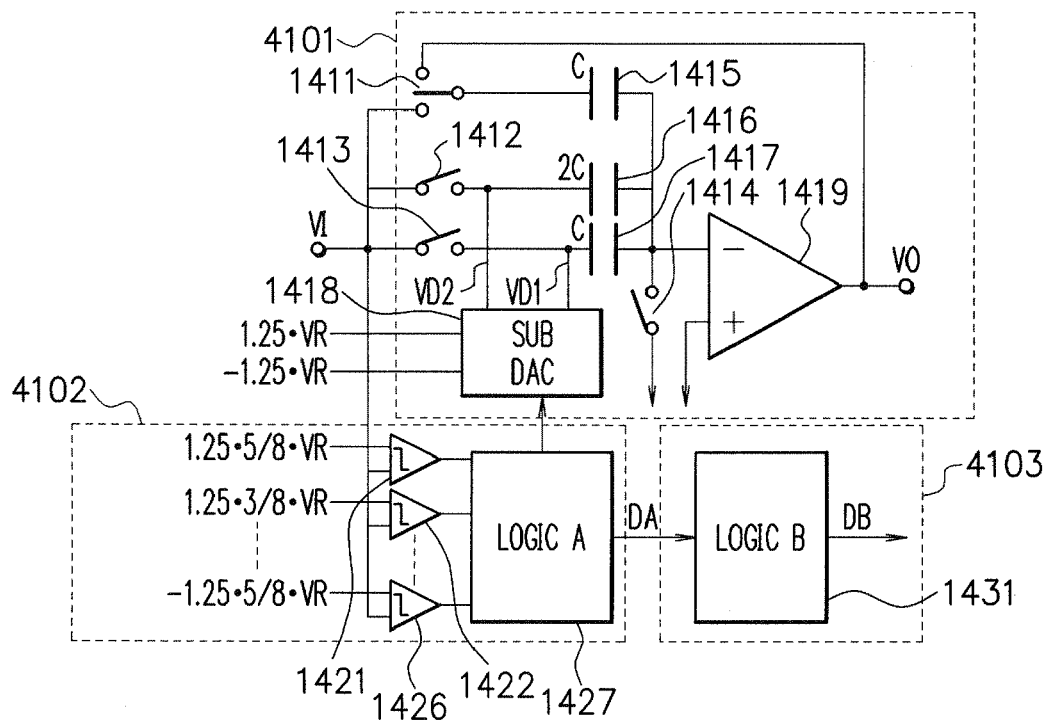
FIG. 43 is a view showing a configuration example of the 2-bit ADC cell in FIG. 42.
FIG. 44 is a view for explaining operations of a first logic operation circuit and a digital-analog converter (Sub DAC)

A comparison circuit in the 2-bit ADC cell 4702 at the second stage and thereafter has 6 comparators 3911 to 3916 (refer to FIG. 43). The comparator 3911 compares with a comparison level of +⅝×VR, the comparator 3912 compares with a comparison level of +⅜×VR, the comparator 3913 compares with a comparison level of +⅛×VR, the comparator 3914 compares with a comparison level of −⅛×VR, the comparator 3915 compares with a comparison level of −⅜×VR, and the comparator 3916 compares with a comparison level of −⅝×VR.

In the characteristics 3902 and 3903 of the ADC cells at the second stage and thereafter, as for VO/VR, a maximum value is 0.5 and a minimum value is −0.5. Thus, in the ADC cells at the third stage and thereafter, the comparator whose comparison level is higher than +0.5×VR and the comparator whose comparison level is lower than −0.5×VR are unnecessary among the comparators 3911 to 3916. That is, in the ADC cells at the third stage and thereafter, the comparators 3911 and 3916 are not required.

Figure 40:
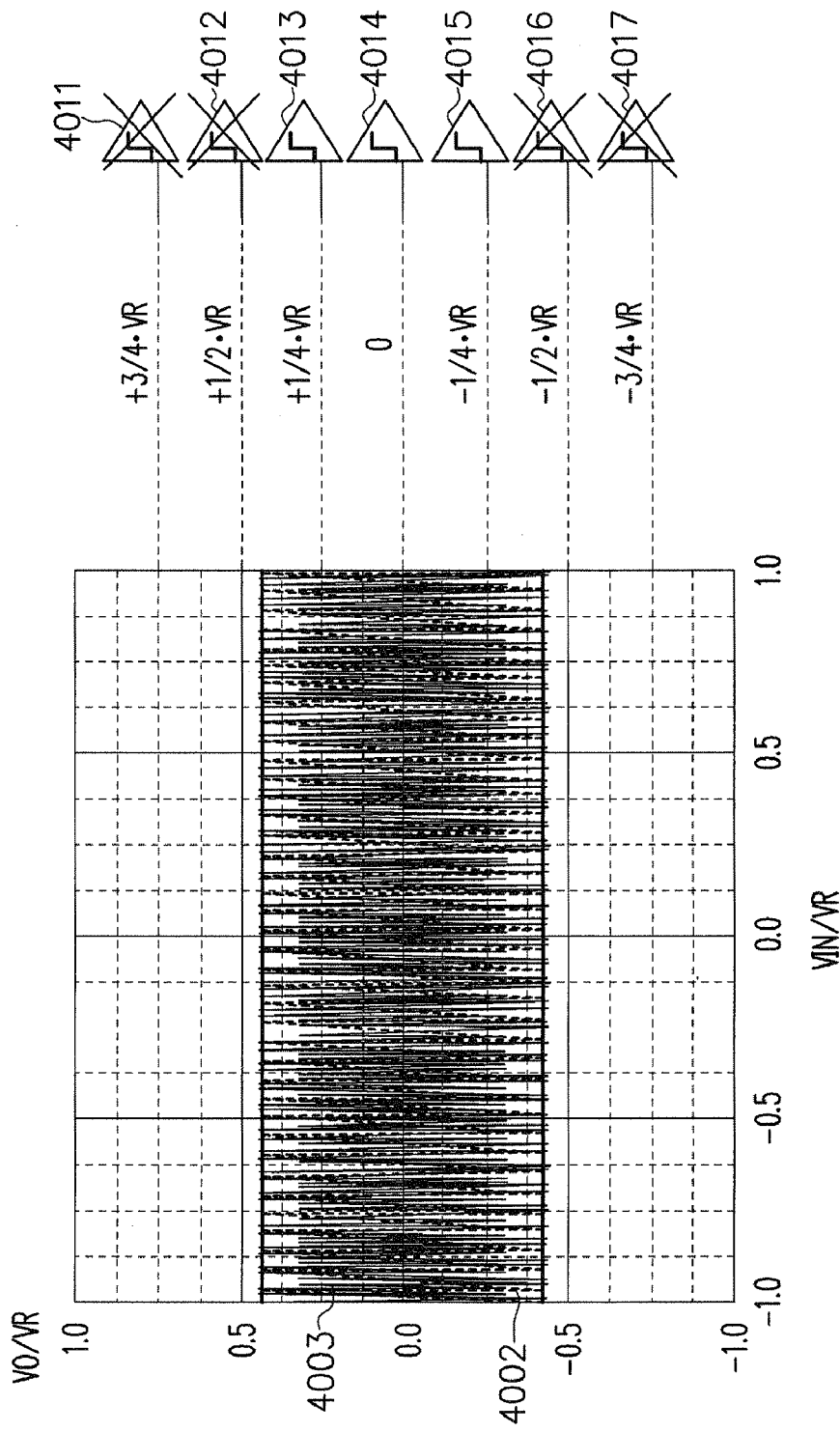
FIG. 40 is a view showing another characteristic of the pipeline type analog-digital converter in FIG. 47.

FIG. 40 is a view showing another characteristic of the pipeline type analog-digital converter in FIG. 47. A point on which FIG. 40 is different from FIG. 39 is a point such that KA of the ADC cells at the second stage and thereafter is 0.875 and KA is a decimal value smaller than 1.

The ADC cell 4701 at the initial stage is the 2-bit ADC cell (the number of areas is 7) with KA=1.25, and a characteristic thereof is the same as that shown in FIG. 34. The ADC cells 4702 at the second stage and thereafter are 2-bit ADC cells (the number of areas is 7) with KA=0.875.

In FIG. 40, a horizontal axis indicates VIN/VR and a vertical axis indicates VO/VR. A characteristic 4002 is a characteristic of the 2-bit ADC cell (the number of areas is 7, KA=0.875) 4702 at the second stage. A characteristic 4003 is a characteristic of the 2-bit ADC cell (the number of areas is 7, KA=0.875) 4702 at a third stage.

A comparison circuit in the 3-bit flash ADC 4703 at a final stage has 7 comparators 4011 to 4017. The comparator 4011 compares with a comparison level of +¾×VR, the comparator 4012 compares with a comparison level of +½×VR, the comparator 4013 compares with a comparison level of +¼×VR, the comparator 4014 compares with a comparison level of 0, the comparator 4015 compares with a comparison level of −¼×VR, the comparator 4016 compares with a comparison level of −½×VR, and the comparator 4017 compares with a comparison level of −¾×VR.

In the characteristics 4002 and 4003 of the ADC cells at the second stage and thereafter, as for VO/VR, a maximum value is 0.4375 and a minimum value is −0.4375. It is further possible to make an absolute value of VO/VR smaller than that of the case in FIG. 39. Thus, in the flash ADC cell 4703 at the final stage, the comparator whose comparison level is equal to or more than +0.5×VR and the comparator whose comparison level is equal to or less than −0.5×VR are unnecessary among the comparators 4011 to 4017. That is, in the flash ADC cell 4703 at the final stage, the comparators 4011, 4012, 4016, and 4017 are not required. Further, similarly to that in FIG. 39, in the ADC cells at the third stage and thereafter, the comparators 3911 and 3916 are not required.

As described above, it is possible to reduce the output signal full scale VOF of the ADC cell while the dynamic range DRF is maintained. An effect thereof is such that in the ADC cell at the initial stage, the output signal full scale VOF can be reduced up to half. This makes it possible to reduce the power supply voltage, and is effective for minute processes. Further, if the output signal full scale VOF is set to be the same as that of a conventional ADC cell, the input signal full scale VIF can be expanded. In the case of the ADC cell in this embodiment, if the input signal full scale VIF can be expanded double, the allowable value of the noise itself also becomes half and the capacitance value can be reduced to a square of 2, namely to ¼. Power is substantially in proportion to the capacitance value, so that power also becomes ¼.

The output signal full scale VOF becomes small, thereby making the determination of the input signal full scale VIF by the unnecessary comparator unnecessary, so that the number of comparators can be reduced. In the case when the ADC cell with KA=1.25 is used at the initial stage and the ADC cells with KA=1 are used at the second stage and thereafter as shown in FIG. 39, an output range at the third stage and thereafter can be suppressed to $(-0.5 \leq (VO/VR) \leq 0.5)$. Accordingly, a comparator performing the determination of $|0.5| < VI$ is not required. Further, when the ADC cell at the second stage is set as KA<1, the output signal full scale VOF is further reduced as shown in FIG. 40 and the comparators whose comparison levels are $\pm \frac{1}{2} \times VR$ are also not required.

Figure 41:
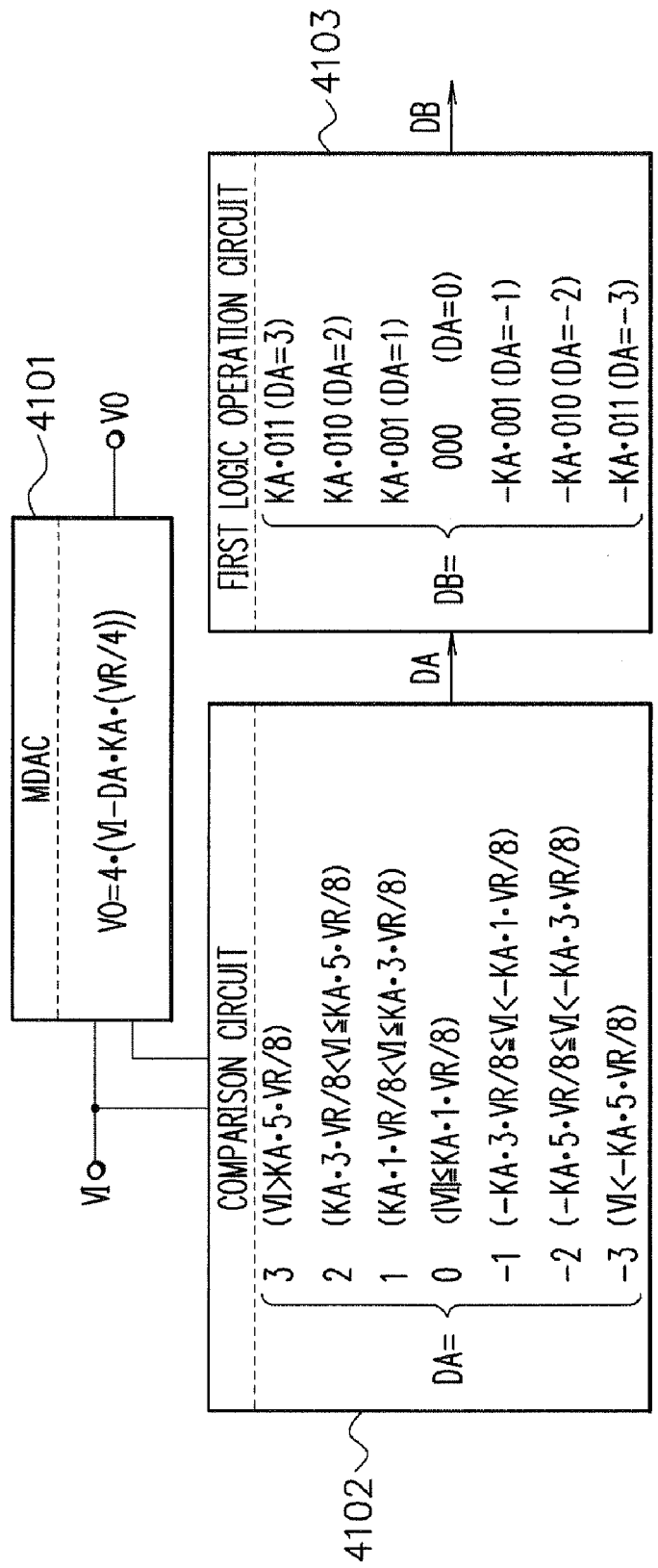
FIG. 41 is a block diagram showing a configuration example of the 2-bit ADC cell (the number of areas is 7)

FIG. 41 is a block diagram showing a configuration example of the 2-bit ADC cell (the number of areas is 7) and corresponds to FIG. 2. An MDAC 4101 corresponds to the MDAC 201 in FIG. 2, a comparison circuit 4102 corresponds to the comparison circuit 202 in FIG. 2, and a first logic operation circuit 4103 corresponds to the first logic operation circuit 203 in FIG. 2. An analog input signal VI, as shown in FIG. 47, is the external analog input signal VIN or the analog output signal VO of the ADC cell 4701 at the preceding stage or the ADC cell 4702 at the preceding stage.

The comparison circuit 4102 compares the analog input signal VI based on six reference voltages of +KA×5×VR/8, +KA×3×VR/8, +KA×1×VR/8, −KA×1×VR/8, −KA×3×VR/8, and −KA×5×VR/8, and outputs a first digital code DA represented by seven values (seven areas) in accordance with a size of the analog input signal VI.

The first digital code DA is 3 in the case of VI>+KA×5×VR/8, it is 2 in the case of +KA××VR/8<VI≦+KA×5×VR/8, it is 1 in the case of +KA×1×VR/8<VI≦+KA×3×VR/8, it is 0 in the case of |VI|≦+KA×1×VR/8, it is −1 in the case of −KA×3×VR/8≦VI<−KA×1×VR/8, it is −2 in the case of −KA×5×VR/8≦VI<−KA×3×VR/8, and it is −3 in the case of VI<−KA×5×VR/8.

The first logic operation circuit 4103 outputs a second digital code DB represented by seven values, which is expressed by DB=DA×KA, based on the first digital code DA. The second digital code DB becomes KA×"11" in the case of DA=3, it becomes KA×"10" in the case of DA=2, it becomes KA×"01" in the case of DA=1, it becomes "00" in the case of DA=0, it becomes −KA×"01" in the case of DA=−1, it becomes −KA×"10" in the case of DA=−2, and it becomes −KA×"11" in the case of DA=−3. The second digital code DB is output to the second logic operation circuit 4704 in FIG. 47.

The MDAC 4101 receives the analog input signal VI and the first digital code DA to output the analog output signal VO expressed by VO=4×(VI−DA×KA×(VR/4)). The analog output signal VO is output to the ADC cell 4702 at a subsequent stage or the flash ADC 4703 in FIG. 47.

Figure 42:
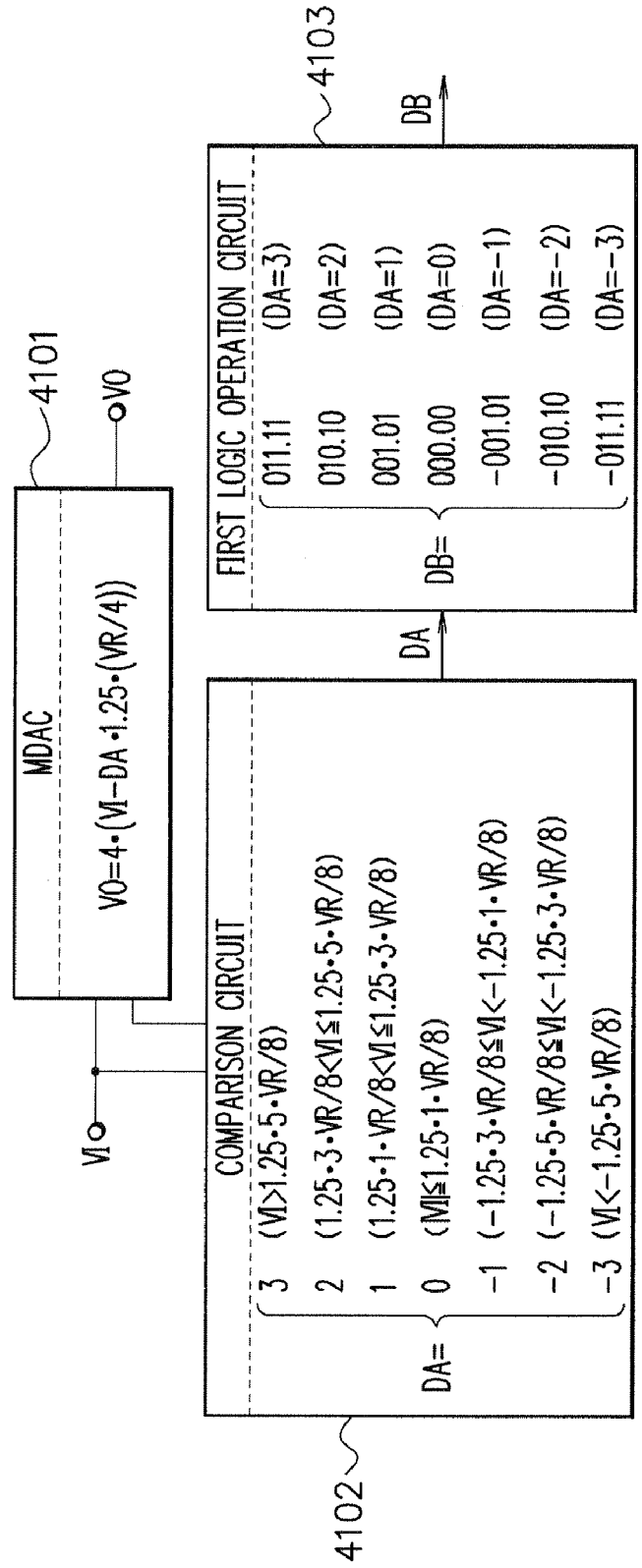
FIG. 42 is a block diagram showing a configuration example of the 2-bit ADC cell (the number of areas is 7) in FIG. 41 in the case of KA=1.25.

FIG. 42 is a block diagram showing a configuration example of the 2-bit ADC cell (the number of areas is 7) in FIG. 41 in the case of KA=1.25.

The comparison circuit 4102 compares the analog input signal VI based on six reference voltages of +1.25×5×VR/8, +1.25×3×VR/8, +1.25×1×VR/8, −1.25×1×VR/8, −1.25×3×VR/8, and −1.25×5×VR/8, and outputs the first digital code DA represented by seven values (seven areas) in accordance with a size of the analog input signal VI.

The first digital code DA is 3 in the case of VI>+1.25×5×VR/8, it is 2 in the case of +1.25×3×VR/8<VI≦+1.25×5×VR/8, it is 1 in the case of +1.25×1×VR/8<VI≦+1.25×3×VR/8, it is 0 in the case of |VI|≦+1.25×1×VR/8, it is −1 in the case of −1.25×3×VR/8≦VI<−1.25×1×VR/8, it is −2 in the case of −1.25×5×VR/8≦VI<−1.25×3×VR/8, and it is −3 in the case of VI<−1.25×5×VR/8.

The first logic operation circuit 4103 outputs the second digital code DB represented by seven values, which is expressed by DB=DA×1.25, based on the first digital code DA. The second digital code DB becomes "11.11" in the case of DA=3, it becomes "10.10" in the case of DA=2, it becomes "01.01" in the case of DA=1, it becomes "00.00" in the case of DA=0, it becomes "−01.01" in the case of DA=−1, it becomes "−10.10" in the case of DA=−2, and it becomes "−11.11" in the case of DA=−3.

The MDAC 4101 receives the analog input signal VI and the first digital code DA to output the analog output signal VO expressed by VO=4×(VI−DA×1.25×(VR/4)).

FIG. 43 is a view showing a configuration example of the 2-bit ADC cell in FIG. 42 and corresponds to FIG. 2. The ADC cell has the MDAC 4101, the comparison circuit 4102, and the first logic operation circuit 4103. The MDAC 4101 has capacitances 1415, 1416 and 1417, an operational amplifier 1419 for inputting a voltage of an interconnection point of first terminals of the capacitances 1415, 1416, and 1417 and outputting the analog output signal (voltage) VO, a digital-analog converter (Sub DAC) 1418 outputting analog signals VD1 and VD2 based on the first digital code DA, a switch 1411 for connecting a second terminal of the capacitance 1415 to either a terminal of the analog input signal (voltage) VI or an output terminal of the operational amplifier 1419, a switch 1412 for connecting a second terminal of the capacitance 1416 to the terminal of the analog input signal VI, a switch 1413 for connecting a second terminal of the capacitance 1417 to the terminal of the analog input signal VI, and a switch 1414 for connecting the interconnection point of the first terminals of the capacitances 1415, 1416, and 1417 and a reference potential. In the capacitances 1415 and 1417, capacitance values are C, and in the capacitance 1416, a capacitance value is 2C. The operational amplifier 1419 has a − input terminal thereof connected to the interconnection point of the first terminals of the capacitances 1415, 1416, and 1417, and has a + input terminal thereof connected to the reference potential. The analog signal VD1 is output to the second terminal of the capacitance 1417, and the analog signal VD2 is output to the second terminal of the capacitance 1416.

The comparison circuit 4102 has six comparators 1421 to 1426 and a logic circuit 1427. The first logic operation circuit 4103 has a logic circuit 1431.

The comparison circuit 4102 compares the analog input signal VI based on the six reference voltages of +1.25×5×VR/8, +1.25×3×VR/8, +1.25×1×VR/8, −1.25×1×VR/8, −1.25×3×VR/8, and −1.25×5×VR/8 as shown in FIG. 42, and outputs the first digital code DA represented by seven values (seven areas) in accordance with a size of the analog input signal VI.

The comparator 1421 turns an output signal to a high level when the analog input signal VI is higher than the reference voltage of +1.25×5×VR/8 and the comparator 1421 turns the output signal to a low level when the analog input signal VI is lower than the reference voltage of +1.25×5×VR/8. The comparator 1422 turns an output signal to a high level when the analog input signal VI is higher than the reference voltage of +1.25×3×VR/8 and the comparator 1422 turns the output signal to a low level when the analog input signal VI is lower than the reference voltage of +1.25×3×VR/8. The comparator 1423 turns an output signal to a high level when the analog input signal VI is higher than the reference voltage of +1.25× 1×VR/8 and the comparator 1423 turns the output signal to a low level when the analog input signal VI is lower than the reference voltage of +1.25×1×VR/8. The comparator 1424 turns an output signal to a high level when the analog input signal VI is higher than the reference voltage of −1.25×1× VR/8 and the comparator 1424 turns the output signal to a low level when the analog input signal VI is lower than the reference voltage of −1.25×1×VR/8. The comparator 1425 turns an output signal to a high level when the analog input signal VI is higher than the reference voltage of −1.25×3×VR/8 and the comparator 1425 turns the output signal to a low level when the analog input signal VI is lower than the reference voltage of −1.25×3×VR/8. The comparator 1426 turns an output signal to a high level when the analog input signal VI is higher than the reference voltage of −1.25×5×VR/8 and the comparator 1425 turns the output signal to a low level when the analog input signal VI is lower than the reference voltage of −1.25×5×VR/8.

The logic circuit 1427 outputs the first digital code DA based on the output signals of the comparators 1421 to 1426. The first digital code DA is 3 in the case of VI>+1.25×5×VR/8, it is 2 in the case of +1.25×3×VR/8<VI≦+1.25×5×VR/8, it is 1 in the case of +1.25×1×VR/8<VI≦+1.25×3×VR/8, it is 0 in the case of |VI|≦+1.25×1×VR/8, it is −1 in the case of −1.25×3×VR/8≦VI<−1.25×1×VR/8, it is −2 in the case of −1.25×5×VR/8≦VI<−1.25×3×VR/8, and it is −3 in the case of VI<−1.25×5×VR/8.

FIG. 44 is a view for explaining operations of the first logic operation circuit 4103 and the digital-analog converter (Sub DAC) 1418.

The first logic operation circuit 4103 has the logic circuit 1431 outputting the second digital code DB represented by seven values, which is expressed by DB=DA×1.25, based on the first digital code DA. The second digital code DB becomes "+11.11" in the case of DA=3, it becomes "+10.10" in the case of DA=2, it becomes "+01.01" in the case of DA=1, it becomes "00.00" in the case of DA=0, it becomes "−01.01" in the case of DA=−1, it becomes "−10.10" in the case of DA=−2, and it becomes "−11.11" in the case of DA=−3.

The digital-analog converter (Sub DAC) 1418 receives reference voltages of +1.25×VR and −1.25×VR and the first digital code DA to output the analog signals VD1 and VD2. The analog signal VD1 becomes +1.25×VR in the case of DA=3 or 1, it becomes 0 in the case of DA=2, 0, or −2, and it becomes −1.25×VR in the case of DA=−1 or −3. The analog signal VD2 becomes +1.25×VR in the case of DA=3 or 2, it becomes 0 in the case of DA=1, 0, or −1, and it becomes −1.25×VR in the case of DA=−2 or −3.

Next, an operation of the MDAC 4101 will be explained. At first, the switch 1411 connects the terminal of the analog input signal VI and the second terminal of the capacitance 1415, the switch 1412 connects the terminal of the analog input signal VI and the second terminal of the capacitance 1416, the switch 1413 connects the terminal of the analog input signal VI and the second terminal of the capacitance 1417, and the switch 1414 connects the interconnection point of the first terminals of the capacitances 1415, 1416, and 1417 and the reference potential. The capacitances 1415 to 1417 are charged by the analog input signal VI. Next, the switch 1411 connects the output terminal of the operational amplifier 1419 and the second terminal of the capacitance 1415, and the switches 1412 to 1414 are opened to thereby disconnect the connections. Accordingly, the analog output signal VO of the operational amplifier 1419 is expressed by the following expression based on the above expression of (9). Here, $A=2^N$, N=2, and KA=1.25.

$$VO=4\times(VI-DA\times1.25\times(VR/4))$$

As described above, when the reference voltage is set as ±VR, the analog input signal VI falls within a range of ±VR as shown in FIG. 34. Firstly, the analog input signal VI is divided into seven areas by using the six comparators 1421 to 1426, and values thereof are set as DA=(−3, −2, −1, 0, 1, 2, 3). Here, the comparison levels are set as ±KA×(1×VR/8), ±KA×(3× VR/8), and ±KA×(5×VR/8), namely ±1.25×(1×VR/8), ±1.25×(3×VR/8), and ±1.25×(5×VR/8). The second digital code DB is a result made after the first digital code DA being an integral multiple of (VIF/8) is multiplied by KA=1.25. That is, the second digital code DB becomes (−011.11, −010.10, −001.01, 000.00, 001.01, 010.10, 011.11) with respect to the respective values of DA=(−3, −2, −1, 0, 1, 2, 3). On the other hand, as for the analog output signal VO, DA×KA×VR is added/subtracted to/from a signal made after the analog input signal VI is quadrupled in the MDAC 4101. That is, DA×1.25×VR is added/subtracted.

FIG. 34 shows the input/output characteristics of the 2-bit ADC cell (the number of areas is 7, KA=1.25) in FIG. 43. It is found that with respect to the dynamic range being (DRF/VIF)=4, the output range of the ADC cell is (VOF/VIR)= 0.625, which is narrow.

Input/output characteristics of the ADC cells at the second stage and the third stage in a pipeline type analog-digital converter in which the ADC cell in FIG. 43 is used at the initial stage and the 2-bit ADC cells (the number of areas is 7, KA=1) are used at the second stage and thereafter are shown in FIG. 39. An output range of the ADC cells at the second stage and thereafter falls within (−0.5≦(VO/VR)≦0.5). This is because the output range is smaller than ±⅞VR and falls within ±0.5VR that are central vicinities where the output of the ADC cell at the second stage is turned back. FIG. 51 is a graph showing the digital codes (DB1, DB2) at the initial stage and the second stage with respect to the analog input signal (VIN/VR) and an AD conversion result (DB1+DB2) at the second stage. A horizontal axis indicates an analog input signal expressed by VIN/VR. A characteristic 5101 shows the digital code DB1, a characteristic 5102 shows the digital code DB2, a characteristic 5103 shows the digital output signal (DB1+DB2) Dout, and a characteristic 5104 shows the analog input signal (VIN/VR). It is found that the analog input signal (VIN/VR) in the characteristic 5104 and the digital output signal (DB1+DB2) Dout in the characteristic 5103 are matched extremely well.

FIG. 45 is a view showing input/output characteristics of the ADC cells at the second stage and the third stage in a pipeline type analog-digital converter in which the 2-bit ADC cell (the number of areas is 7, KA=1.25) in FIG. 43 is used at the initial stage and the 1.5-bit ADC cells (the number of areas is 3, KA=1) are used at the second stage and thereafter. A characteristic 4502 is a characteristic of the ADC cell at the second stage, and a characteristic 4503 is a characteristic of the ADC cell at the third stage. In the characteristics 4502 and 4503, a maximum value of VO/VR is 0.5, and a minimum value of VO/VR is −0.5.

An output range of the ADC cells at the second stage and thereafter falls within (−0.5≦(VO/VR)≦0.5). This is because the output range is smaller than ±¾VR and falls within ±0.5VR that are central vicinities where the output of the ADC cell at the second stage is turned back. A range of KA in which the output range becomes smaller than ±¾VR as described above in the N-bit ADC cell, from FIG. 32 and FIG. 36, is $(2^N-¾)/(2^N-1) \leq KA \leq ¾$ when Q being the number of areas is an odd number, and it becomes $(2^N-¾)/(2^N-½) \leq KA \leq ¾$ when Q being the number of areas is an even number.

Figure 46:
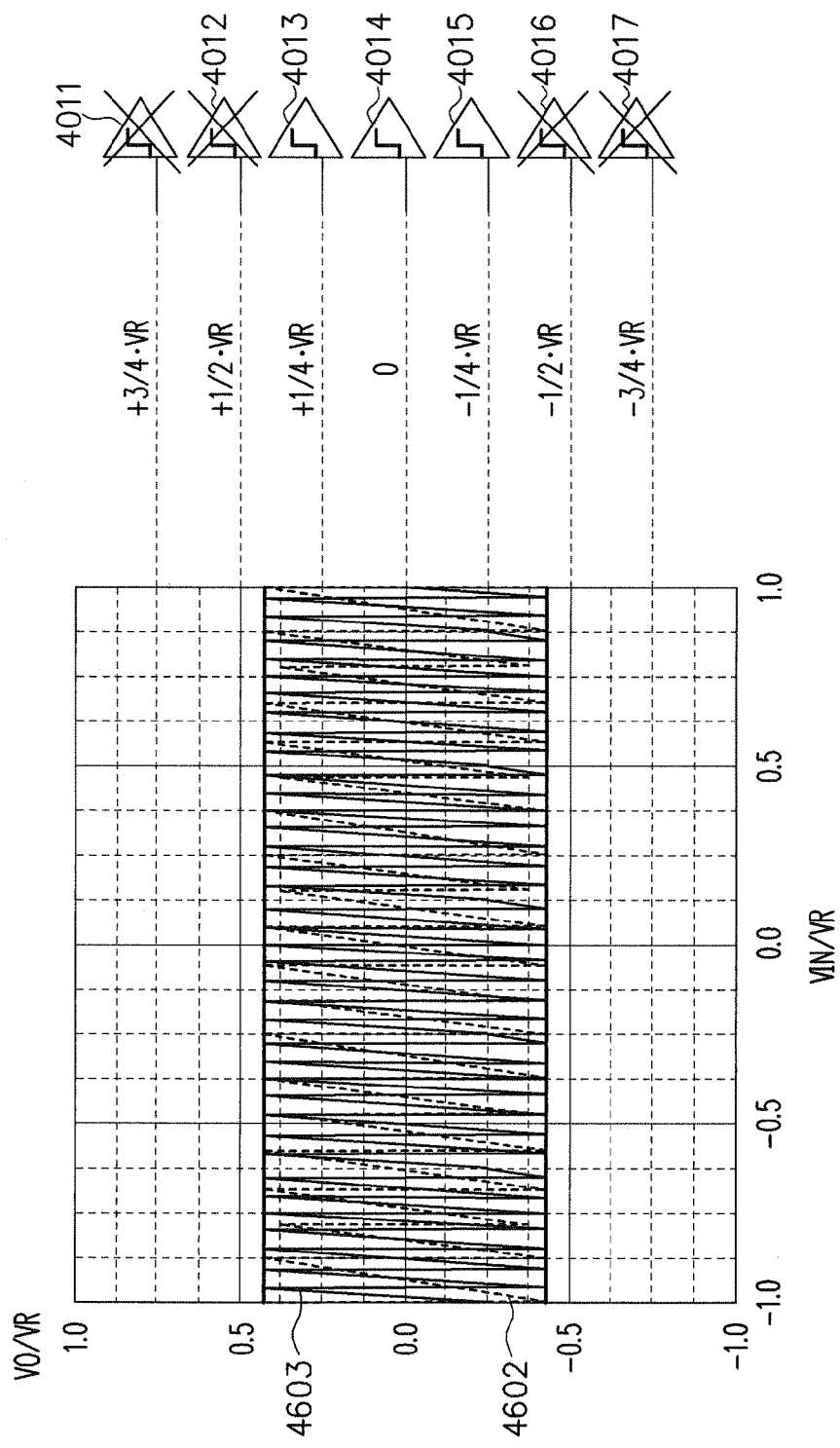
FIG. 46 is a view showing input/output characteristics of the ADC cells at a second stage and a third stage in a pipeline type analog-digital converter in which the 2-bit ADC cell (the number of areas is 7, KA=1.25) in FIG. 43 is used at an initial stage and the 1.5-bit ADC cells (the number of areas is 3, KA=0.875) are used at the second stage and thereafter.

FIG. 46 a view showing input/output characteristics of the ADC cells at the second stage and the third stage in the pipeline type analog-digital converter in which the 2-bit ADC cell (the number of areas is 7, KA=1.25) in FIG. 43 is used at the initial stage and the 1.5-bit ADC cells (the number of areas is 3, KA=0.875) are used at the second stage and thereafter. A characteristic 4602 is a characteristic of the ADC cell at the second stage, and a characteristic 4603 is a characteristic of the ADC cell at the third stage. In the characteristics 4602 and 4603, a maximum value of VO/VR is 0.4375, and a minimum value of VO/VR is –0.4375.

An output range of the ADC cells at the second stage and thereafter becomes ±0.4375VR. When KA of the ADC cells at the second stage and thereafter is set to be less than 1 (KA<1), sizes of addition/subtraction of a reference at which the output is turned back become small, and the output range can be set much smaller. There is sometimes a case that the 2-bit or more flash ADC 4703 is used at the final stage in the pipeline type analog-digital converter in FIG. 47. In the case when the 3-bit flash ADC 4703 is set at the final stage, determination levels of the seven comparators 4011 to 4017 in the flash ADC 4703 are set as (+¾VR, +½VR, +¼VR, 0, –¼VR, –½VR, –¾VR). When it is set as KA<1, the four comparators 4011, 4012, 4016, and 4017 determining the determination levels of +¾VR, +½VR, –½VR, and –¾VR are not required.

It is preferable that the ADC cell with KA<1 is provided at a stage subsequent to the ADC cell with 1<KA<2.

Figure 48:
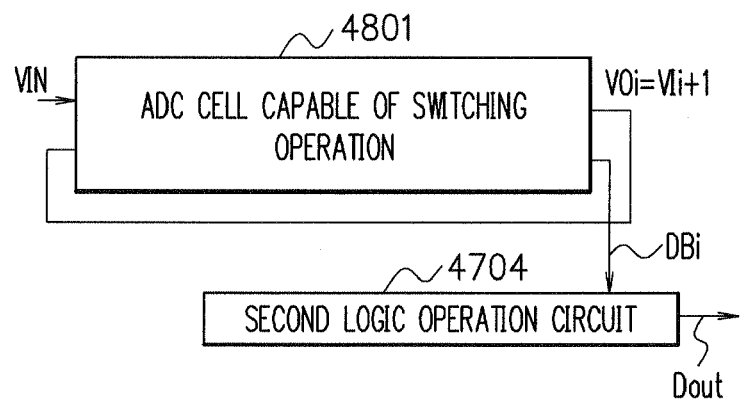
FIG. 48 is a view showing a configuration example of a cycle type analog-digital converter using an N-bit ADC cell.

FIG. 48 is a view showing a configuration example of a cycle type analog-digital converter using an N-bit ADC cell, and corresponds to FIG. 18 and FIG. 19. An N-bit ADC cell 4801 is an ADC cell capable of switching operation. At a first stage, the ADC cell 4801 operates as the ADC cell 4701 at the initial stage in FIG. 47. The ADC cell 4801 receives an analog input signal VIN and outputs an analog output signal VO1 to the input in a feedback manner to output a second digital code DB1 to a second logic operation circuit 4704. Next, at a second stage, the ADC cell 4801 operates as the ADC cell 4702 at the second stage in FIG. 47. The ADC cell 4801 receives the analog output signal VO1 as an analog input signal VI2 and outputs an analog output signal VO2 to the input in a feedback manner to output a second digital code DB2 to the second logic operation circuit 4704. As described above, at an ith stage, the ADC cell 4801 operates as an ADC cell at an ith stage. The ADC cell 4801 receives an analog output signal VOi–1 as an analog input signal VII and outputs an analog output signal VOi to the input in a feedback manner to output a second digital code DBi to the second logic operation circuit 4704. The second logic operation circuit 4704 similarly to the second logic operation circuit 4704 in FIG. 47, outputs a digital output signal Dout based on the second digital code DBi. Note that a sample and hold circuit 101 may be provided as shown in FIG. 18 and FIG. 19.

As described above, the analog-digital converter has the one or more analog-digital conversion cells. While an analog signal is being converted into a digital output signal, at least the above-described one or more analog-digital conversion cells are used twice or more. The second logic operation circuit 4704 outputs the digital output signal Dout being an analog-digital conversion result based on the second digital code DBi output by each of the conversion operations of the above-described analog-digital conversion cells. The above-described analog-digital conversion cell/cells performs/perform the operation of the analog-digital conversion cell with 1<KA<2 at least once or more. It is preferable that at an initial use of the above-described analog-digital conversion cell, the operation of the analog-digital conversion cell with 1<KA<2 is performed.

Figure 49:
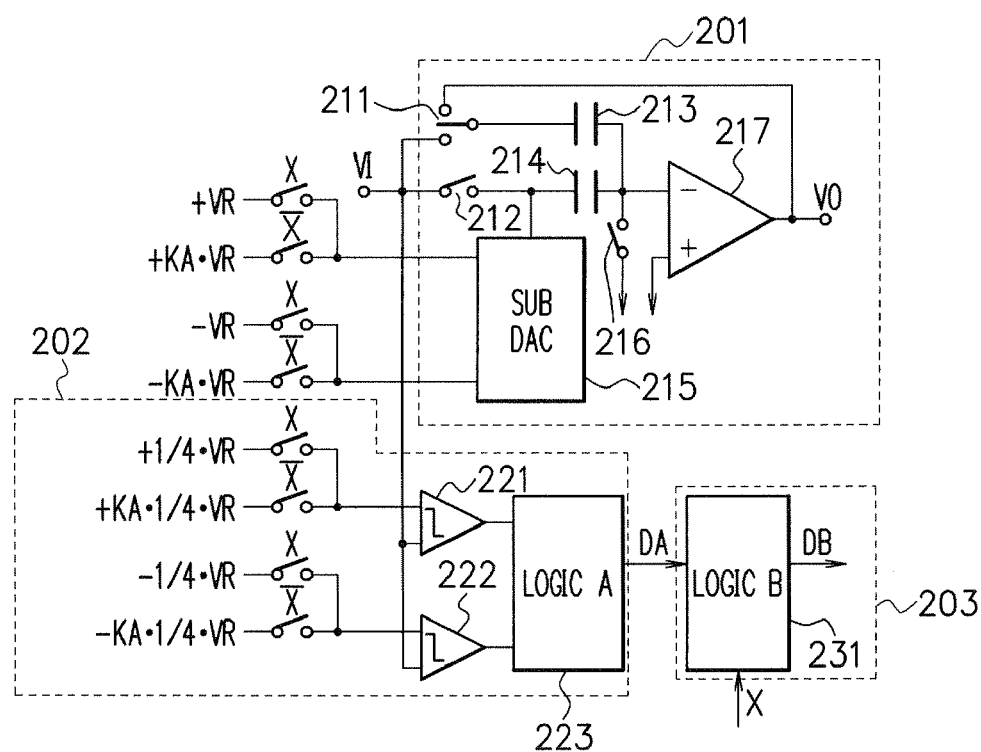
FIG. 49 is a circuit diagram showing a configuration example of the ADC cell capable of switching operation in FIG. 48.

FIG. 49 is a circuit diagram showing a configuration example of the ADC cell 4801 capable of switching operation in FIG. 48. As an example, an ADC cell capable of switching the 1.5-bit ADC cell (1<KA<2) at the initial stage and the 1.5-bit ADC cells (KA=1) at the second stage and thereafter will be explained. Hereinafter, points on which FIG. 49 is different from FIG. 2 will be explained.

When a control signal X is turned to a high level, the ADC cell becomes the ADC cell (KA=1) in FIG. 22, and when the control signal X is turned to a low level, the ADC cell becomes the ADC cell (1<KA<2) in FIG. 2.

A digital-analog converter (Sub DAC) 215, by a switch, receives reference voltages of +VR and –VR when the control signal X is turned to a high level, and the digital-analog converter (Sub DAC) 215 receives reference voltages of +KA×VR and –KA×VR when the control signal X is turned to a low level.

Comparators 221 and 222, by a switch, receives reference voltages of +VR/4 and –VR/4 when the control signal X is turned to a high level, and the comparator 221 receives reference voltages of +KA×VR/4 and –KA×VR/4 when the control signal X is turned to a low level.

A first logic operation circuit 203 outputs a second digital code DB=DA+DB0 when the control signal X is turned to a high level, and the first logic operation circuit 203 outputs a second digital code DB=DA×KA+DB0 when the control signal X is turned to a low level.

As described above, most of the two types of the ADC cells can be made in common, so that a size of the ADC cell 4801 can be made small.

According to the above-described embodiments, in the N-bit ADC cell, the output signal full scale VOF of the ADC cell can be reduced while the dynamic range DRF is maintained. An effect thereof is such that the output signal full scale VOF of the ADC cell can be reduced up to half. This makes it possible to reduce the power supply voltage and is effective for minute processes. Further, if the output signal full scale VOF is set as the same as that of the conventional ADC cell, the input signal full scale VIF can be expanded. In the case of the ADC cell in this embodiment, if the input signal full scale VIF can be expanded double, the allowable value of the noise itself also becomes half and the capacitance value can be reduced to a square of 2, namely to ¼. Power is substantially in proportion to the capacitance value, so that power also becomes ¼.

Further, when the output signal full scale VOF is made small, the determination of the input signal full scale VIF by the unnecessary comparator is not required, and the number of comparators in the ADC cell and/or the flash ADC can be reduced.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

INDUSTRIAL APPLICABILITY

With respect to the same dynamic range, an output range of an analog output signal can be reduced and a power supply voltage and power consumption can be reduced. Further, with respect to the same output range of an analog output signal and the same power supply voltage, a dynamic range can be expanded and current consumption and power consumption can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog-digital conversion cell being an analog-digital conversion cell that performs an N-bit analog-digital conversion (where N is a natural number), the analog-digital conversion cell comprising:
   a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI;
   a first logic operation circuit outputting a second digital code DB selected from Q digital codes, which is expressed by DB=DA×KA+DB0 where a constant KA is a decimal number satisfying a condition of 1<KA<2 and DB0 is a constant, based on the first digital code DA; and
   an analog operation circuit outputting an analog output signal VO expressed by VO=A×(VI−DA×KA×(VR/A)) where A and VR are constants, based on the first digital code DA and the analog input signal VI.

2. The analog-digital conversion cell according to claim 1, wherein
   the plural reference voltages of said comparison circuit are ±KA×VR×C/$2^{N+1}$, and when the Q is an odd number, C is ±1, ±3, ..., ±(Q−2), and when the Q is an even number, C is 0, ±2, ±4, ..., ±(Q−2).

3. The analog-digital conversion cell according to claim 1, wherein
   the first digital code DA is selected from Q digital codes, and the first digital code DA is 0, ±1, ±2, ..., ±(Q−1)/2 when the Q is an odd number, and the first digital code DA is ±½, ±3⁄2, ..., ±(Q−3)/2 when the Q is an even number.

4. The analog-digital conversion cell according to claim 1, wherein
   the constant KA is equal to or more than $(2^N-¾)/(2^N-1)$ and equal to or less than 3⁄2 when the Q is an odd number, and the constant KA is equal to or more than $(2^N-¾)/(2^N-½)$ and equal to or less than 3⁄2 when the Q is an even number.

5. The analog-digital conversion cell according to claim 1, wherein
   the constant KA is 5⁄4 and the second digital code DB is represented by three values of +1.01, 0.00, and −1.01 in a binary number, or the constant KA is 3⁄2 and the second digital code DB is represented by three values of +1.1, 0.0, and −1.1 in a binary number, or the constant KA is 21⁄16 and the second digital code DB is represented by three values of +1.0101, 0.0000, and −1.0101 in a binary number.

6. The analog-digital conversion cell according to claim 1, wherein
   said analog operation circuit includes two or more capacitances for sampling the analog input signal VI and one operational amplifier, and when outputting the analog output signal VO, at least the one or more capacitances out of the capacitances is/are connected to an output of the operational amplifier and the other capacitance/capacitances is/are connected to a voltage in accordance with the first digital code DA.

7. The analog-digital conversion cell according to claim 1, wherein
   said analog operation circuit includes:
   a first capacitance;
   a second capacitance;
   an operational amplifier in which a voltage of an interconnection point of first terminals of the first and second capacitances is input, and outputting the analog output signal VO;
   a digital-analog conversion cell outputting a first analog signal to a second terminal of the second capacitance based on the first digital code DA;
   a first switch connecting a second terminal of the first capacitance to either a terminal of the analog input signal VI or an output terminal of the operational amplifier;
   a second switch connecting the second terminal of the second capacitance to the terminal of the analog input signal VI; and
   a third switch connecting the interconnection point of the first terminals of the first and second capacitances and a reference potential.

8. An analog-digital converter comprising:
   two or more analog-digital conversion cells; and
   a second logic operation circuit outputting a digital output signal that is an analog-digital conversion result based on a second digital code that each of said analog-digital conversion cells outputs, and wherein
   at least one or more out of said two or more analog-digital conversion cells is/are the analog-digital conversion cell according to claim 1.

9. The analog-digital converter according to claim 8, wherein
   out of said two or more analog-digital conversion cells, said analog-digital conversion cell at an initial stage is the analog-digital conversion cell according to claim 1.

10. The analog-digital converter according to claim 9, wherein
    said analog-digital conversion cells at a second stage and thereafter are an analog-digital conversion cell performing an N-bit analog-digital conversion (where N is a natural number), and include;
    a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI;
    a first logic operation circuit outputting a second digital code DB selected from Q digital codes, which is expressed by DB=DA×KA+DB0 where a constant KA is a decimal number satisfying a condition of 1<KA<2 or KA<1 and DB0 is a constant, based on the first digital code DA; and an analog operation circuit outputting an analog output signal VO expressed by VO=A×(VI−DA×KA×(VR/A)) where A and VR are constants, based on the first digital code DA and the analog input signal VI, and the comparison circuit has Q-2 or less comparators.

11. The analog-digital converter according to claim 8, wherein one of said analog-digital conversion cells at a second stage and thereafter out of said two or more analog-digital conversion cells is an analog-digital conversion cell performing an N-bit analog-digital conversion (where N is a natural number), and includes;

a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI;

a first logic operation circuit outputting a second digital code DB selected from Q digital codes, which is expressed by DB=DA×KA+DB0 where a constant KA is 1 and DB0 is a constant, based on the first digital code DA; and an analog operation circuit outputting an analog output signal VO expressed by VO=A×(VI−DA×KA×(VR/A)) where A and VR are constants, based on the first digital code DA and the analog input signal VI.

12. The analog-digital converter according to claim 8, wherein one of said analog-digital conversion cells at a second stage and thereafter out of said two or more analog-digital conversion cells is an analog-digital conversion cell performing an N-bit analog-digital conversion (where N is a natural number that is equal to or more than 2), and includes;

a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI;

a first logic operation circuit outputting a second digital code DB selected from Q digital codes, which is expressed by DB=DA×KA+DB0 where KA and DB0 are constants, based on the first digital code DA; and an analog operation circuit outputting an analog output signal VO expressed by VO=A×(VI−DA×KA×(VR/A)) where A and VR are constants, based on the first digital code DA and the analog input signal VI.

13. The analog-digital converter according to claim 8, wherein one of said analog-digital conversion cells at a second stage and thereafter out of said two or more analog-digital conversion cells is an analog-digital conversion cell performing an N-bit analog-digital conversion (where N is a natural number), and includes;

a comparison circuit comparing an analog input signal VI based on a plurality of reference voltages and outputting a first digital code DA selected from Q digital codes (where Q is a natural number equal to or more than $2^N+1$ and equal to or less than $2^{N+1}-1$) in accordance with a size of the analog input signal VI;

a first logic operation circuit outputting a second digital code DB selected from Q digital codes, which is expressed by DB=DA×KA+DB0 where a constant KA is less than 1 and DB0 is a constant, based on the first digital code DA; and an analog operation circuit outputting an analog output signal VO expressed by VO=A×(VI−DA×KA×(VR/A)) where A and VR are constants, based on the first digital code DA and the analog input signal VI.

14. The analog-digital converter according to claim 13, wherein in said analog-digital conversion cell at a subsequent stage, the constant A is $2^N$, the plural reference voltages of the comparison circuit are $\pm KA \times VR \times C/2^{N+1}$, and when the Q is an odd number, C is ±1, ±3, ..., ±(Q−2), and when the Q is an even number, C is 0, ±2, ±4, ..., ±(Q−2), and the first digital code DA is selected from Q digital codes, and the first digital code DA is 0, ±1, ±2, ..., ±(Q−1)/2 when the Q is an odd number, and the first digital code DA is ±½, ±3⁄2, ..., ±(Q−3)/2 when the Q is an even number.

15. The analog-digital converter according to claim 13, wherein the analog operation circuit in said analog-digital conversion cell at the subsequent stage includes two or more capacitances for sampling the analog input signal VI and one operational amplifier, and when outputting the analog output signal VO, at least the one or more capacitances out of the capacitances is/are connected to an output of the operational amplifier and the other capacitance/capacitances is/are connected to a voltage in accordance with the first digital code DA.

16. The analog-digital converter according to claim 8, wherein said second logic operation circuit operates a digital output signal that is an analog-digital conversion result based on the second digital code that each of said analog-digital conversion cells outputs, and when the digital output signal is a value larger than a maximum value of a code capable of an AD conversion, said second logic operation circuit outputs the maximum value as the digital output signal, and when the digital output signal is a value smaller than a minimum value of a code capable of an AD conversion, said second logic operation circuit outputs the minimum value as the digital output signal.

17. An analog-digital converter being an analog-digital converter that includes one or more analog-digital conversion cells and uses at least the one or more analog-digital conversion cells two times or more while converting an analog signal into a digital signal output, the analog-digital converter comprising:

a second logic operation circuit outputting a digital output signal that is an analog-digital conversion result based on a second digital code output by each conversion operation in the analog-digital conversion cell, and wherein the analog-digital conversion cell performs an operation of the analog-digital conversion cell according to claim 1 at least once or more.

18. The analog-digital converter according to claim 17, wherein at an initial use of the analog-digital conversion cell, the operation of the analog-digital conversion cell according to claim 1 is performed.

* * * * *

UNITED STATES PATENT AND TRADEMARK OFFICE
CERTIFICATE OF CORRECTION

| | | |
|---|---|---|
| PATENT NO. | : 7,986,258 B2 | Page 1 of 1 |
| APPLICATION NO. | : 12/698853 | |
| DATED | : July 26, 2011 | |
| INVENTOR(S) | : Kunihiko Gotoh et al. | |

It is certified that error appears in the above-identified patent and that said Letters Patent is hereby corrected as shown below:

<u>ON THE TITLE PAGE, after item (57), should read:</u>

19 Claims, 34 Drawing Sheets

<u>IN THE CLAIMS</u>:

Please insert claim 19 with the following claim:

--19. The analog-digital converter according to claim 17, wherein said second logic operation circuit operates a digital output signal that is an analog-digital conversion result based on the second digital code that each of the analog-digital conversion cells outputs, and when the digital output signal is a value larger than a maximum value of a code capable of an AD conversion, said second logic operation circuit outputs the maximum value as the digital output signal, and when the digital output signal is a value smaller than a minimum value of a code capable of an AD conversion, said second logic operation circuit outputs the minimum value as the digital output signal.--

Signed and Sealed this
Twenty-second Day of May, 2012

David J. Kappos
*Director of the United States Patent and Trademark Office*